(12) United States Patent
Kakiuchi et al.

(10) Patent No.: US 7,647,191 B2
(45) Date of Patent: Jan. 12, 2010

(54) ACCUMULATOR STATE DETECTION DEVICE

(75) Inventors: Kimiyasu Kakiuchi, Osaka (JP); Yoksuke Mitani, Osaka (JP)

(73) Assignee: Panasonic Corporation, Osaka (JP)

(*) Notice: Subject to any disclaimer, the term of this patent is extended or adjusted under 35 U.S.C. 154(b) by 182 days.

(21) Appl. No.: 11/720,136

(22) PCT Filed: Sep. 5, 2006

(86) PCT No.: PCT/JP2006/317501
§ 371 (c)(1),
(2), (4) Date: May 24, 2007

(87) PCT Pub. No.: WO2007/029673
PCT Pub. Date: Mar. 15, 2007

(65) Prior Publication Data
US 2009/0228221 A1 Sep. 10, 2009

(30) Foreign Application Priority Data
Sep. 5, 2005 (JP) ............... 2005-255931
Sep. 5, 2005 (JP) ............... 2005-255932

(51) Int. Cl.
*G01R 31/00* (2006.01)
*G01R 31/36* (2006.01)

(52) U.S. Cl. ............... 702/58; 702/59; 702/60; 702/63; 324/765

(58) Field of Classification Search ............ 702/58–65, 702/117, 118, 188; 324/765
See application file for complete search history.

(56) References Cited

U.S. PATENT DOCUMENTS
5,809,315 A * 9/1998 Ohtsuka ............... 713/323

FOREIGN PATENT DOCUMENTS

| JP | 2-078964 | 3/1990 |
|---|---|---|
| JP | 8-339829 | 12/1996 |
| JP | 2000-065906 | 3/2000 |
| JP | 2002-084669 | 3/2002 |
| JP | 2002-084669 A * | 3/2002 |
| JP | 2002-281686 | 9/2002 |
| JP | 2003-070179 | 3/2003 |
| JP | 2003-110300 | 4/2003 |
| JP | 2003-274566 | 9/2003 |
| JP | 2005-028908 | 2/2005 |
| JP | 2005-110439 | 4/2005 |

OTHER PUBLICATIONS

International Search Report (PCT/JP2006/317501) dated Dec. 12, 2006.

* cited by examiner

*Primary Examiner*—Eliseo Ramos Feliciano
*Assistant Examiner*—Phuong Huynh
(74) *Attorney, Agent, or Firm*—Pearne & Gordon LLP

(57) ABSTRACT

A detector for detecting a state of an electrical storage device includes capacitor blocks formed of a capacitor-voltage equalizing circuit and a capacitor-voltage detecting circuit both coupled to respective capacitors, and a capacitor-block state outputting circuit outputting states of the capacitors by using the signals supplied from the capacitor-voltage detecting circuits. The signals from the capacitor-voltage detecting circuits are transmitted via an optical switch, which works as an electrical indirect coupler, to the capacitor-block state outputting circuit. This structure allows isolating high-voltage oriented wirings completely from signal oriented wirings, so that high reliability can be ensured.

8 Claims, 11 Drawing Sheets

PRIOR ART

ACCUMULATOR STATE DETECTION DEVICE

This application is a U.S. national phase application of PCT International Application PCT/JP2006/317501.

TECHNICAL FIELD

The present invention relates to a detector for detecting states of capacitors forming an electrical storage device.

BACKGROUND ART

Electric vehicles and hybrid cars have been popularized recently because they are driven by a motor entirely or in part in order to protect the environment. The motors of those cars are powered by batteries, which are vulnerable to a quick discharge or recharge with a large amount of current and thus tend to change or deteriorate their characteristics. Therefore the electric current to be supplied to the motor is regulated particularly at a quick acceleration, so that the car sometimes cannot be sufficiently accelerated.

A car employing capacitors quickly dischargeable besides a battery is devised for allowing quicker acceleration than the acceleration with the battery only. This structure allows powering the motor at the quick acceleration with the capacitors in addition to the battery, so that the car can be accelerated quicker than it is accelerated only with the battery. An electrical storage device formed of capacitors is described hereinafter.

A voltage great enough to drive a motor is approx. 750V, which needs 300 pieces of capacitors rated at 2.5V coupled together in series, and parallel couplings can be used sometimes together with the series coupling in order to obtain necessary capacitance.

Since the capacitors have dispersion, and voltages applied to the capacitors are dispersed, a charge to the capacitors without considering the dispersion will substantially shorten the life of capacitors, and in the worst case, it breaks some capacitors. Thus methods of monitoring the states of a large number of capacitors and detecting an abnormality have been devised.

FIG. 11 shows a block circuit diagram illustrating a conventional method of detecting an abnormality in an electrical storage device. In FIG. 11, when DC power supply 1 charges a plurality of capacitors 2 rated at 2.5V, current detector 3 and voltage detector 4 measure respectively a current running through capacitors 2 and voltages across capacitors 2. Based on the measuring results, controller 5 regulates the charge to capacitors 2 and determines whether or not capacitors 2 are abnormal. The prior art discussed above is disclosed, e.g. in Unexamined Japanese Patent Publication No. 2003-274566.

The method discussed above can definitely detect an abnormal capacitor; however, when the capacitors are used auxiliary to a battery for driving a motor of a hybrid car, approx. as high as 750V is applied across entire capacitors 2 at the completion of charge, so that an extremely high voltage (approx. 750V) is applied to the whole circuit shown in FIG. 11. On the other hand, controller 5 calculates an amount of electric charge and an amount of electrostatic capacity based on the figures measured by current detector 3 and voltage detector 4 in order to determine the abnormality. For this purpose, an AD converter and a microprocessor are used, and those devices generally use DC 5V as their power source voltage. The block diagram shown in FIG. 11 tells that the results measured by current detector 3 and voltage detector 4, to both of which the high voltage is directly applied, are fed firsthand into controller 5, so that no one can deny that a defect or a malfunction, such as switch 6 and switch 7 are turned on simultaneously, can happen. If the high voltage is applied to controller 5 via current detector 3 or voltage detector 4, controller 5 can be malfunctioned and broken due to the high voltage far exceeding its allowable voltage.

Here is another problem: when capacitors 2 are discharged, a DC-DC converter is used for converting the specification into the one complying with the motor used in the hybrid cars. Noises generated by the converter can enter into controller 5 via current detector 3 or voltage detector 4. In this case, controller 5 sometimes malfunctions and cannot read the current or the voltage correctly.

On top of that, the foregoing method of detecting abnormality can surely detect an abnormal capacitor; however, when the capacitors are used auxiliary to the battery for driving the motor of the hybrid car, as many as 300 pieces of capacitors are needed as described previously. Thus switch 6 is provided to each one of capacitors 2, and the respective switches 6 are controlled by controller 5 via switch controller 7, so that at least over 300 long wires are needed between switch controller 7 and controller 5. As a result, the wirings become complicated and the weight of the car becomes heavier, which possibly lowers the excellent gas mileage of the hybrid car.

DISCLOSURE OF INVENTION

The present invention aims to provide a reliable detector for detecting a state of an electrical storage device, which detector works normally even in an environment where a high voltage per se and high-voltage oriented noises coexist. The present invention also aims to provide a reliable detector for detecting states of a large number of capacitors used in an electrical storage device, which device can be simply constructed because of reductions of the number of wirings and the length of the wirings.

A detector of the present invention for detecting a state of an electrical storage device comprises the following elements:

a capacitor block including capacitors and capacitor voltage detecting circuits coupled to the respective capacitors or a plurality of capacitors in groups; and a capacitor-block state outputting circuit for outputting the states of the capacitors by using signals supplied from the capacitor voltage detecting circuits.

The signals supplied from the capacitor voltage detecting circuits are transmitted to the capacitor-block state outputting circuit via an electrical indirect coupler.

The foregoing structure does not allow the capacitor voltage detecting circuit (corresponding to conventional voltage detector 4 shown in FIG. 11) to output a signal directly to the capacitor-block state outputting circuit (corresponding to conventional controller 5 shown in FIG. 11). Thus even if a high voltage per se or a high-voltage oriented noise due to the operation of the DC-DC converter is superimposed on a signal supplied from the capacitor voltage detecting circuit, the capacitor-block state outputting circuit is not affected by this superimposition. In other words, the capacitor-block state outputting circuit is free from the application of the high voltage or the high-voltage oriented noises, so that a reliable detection of a capacitor state can be expected.

Another detector of the present invention for detecting a state of an electrical storage device comprises the following elements:

a plurality of capacitor blocks and each one of the capacitor blocks including:
switches, coupled to each one of the capacitors or a plurality of capacitors in groups, for selecting a capacitor;
a voltage detector for measuring a voltage of the capacitor selected by the switch;
a temperature sensor placed near the capacitors;
a microprocessor for switching the switch, receiving an output from the voltage detector and an output from the temperature sensor; and
a data communicating device for receiving and outputting the data supplied from the microprocessor; and
a main computer for exchanging data with the capacitor blocks and receiving an electric current of the capacitors.

The foregoing structure allows the microprocessor placed in the respective capacitor blocks to switchover the switch, so that the wiring necessary for the switching can be closed within the capacitor block and is not led out to the outside. Thus the number of and the length of external wirings can be substantially reduced, and a reliable detection of an abnormal capacitor can be expected with a simple structure.

Figure 1:
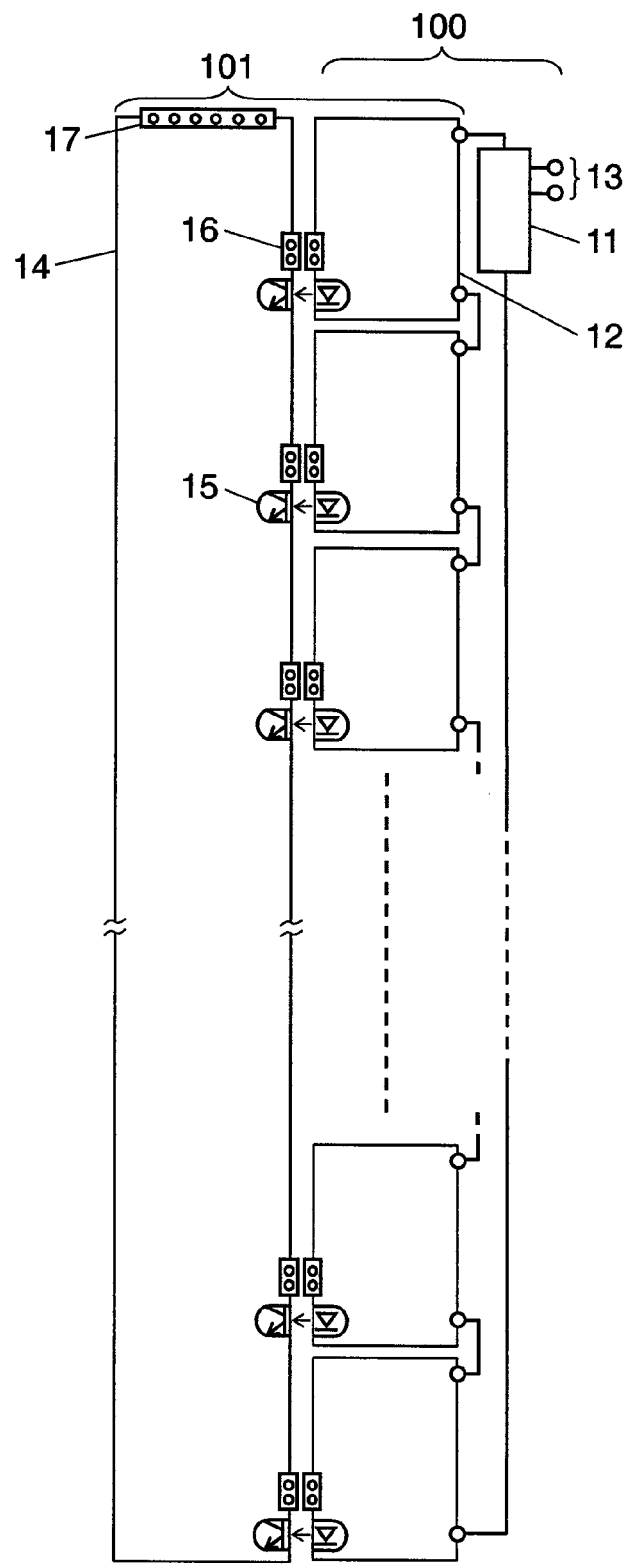
FIG. 1 shows a schematic block circuit diagram of a detector in accordance with a first embodiment of the present invention for detecting a state of an electrical storage device.

DESCRIPTION OF REFERENCE MARKS 11, 51 charge/discharge control circuit
15, 52 capacitor block
14 capacitor-block state outputting circuit
15 optical switch
18, 58 capacitor
19 capacitor-voltage equalizing circuit
20 capacitor-voltage detecting circuit
22 capacitor-block voltage equalizing circuit
23, 65 temperature sensor
31 radio transmission/reception medium
51a current detector
55 data communication medium
59 switch
62 voltage detector
63 microprocessor
65 temperature sensor
69 main computer
72 voltage regulator
73 multiplexer
100, 500 electrical storage device
101, 501 detector for detecting a state of an electrical storage device

DESCRIPTION OF PREFERRED EMBODIMENTS

Exemplary embodiments of the present invention are demonstrated hereinafter with reference to the accompanying drawings. The embodiments refer to detectors for detecting a state of an electrical storage device, which detector is provided to a hybrid car.

Exemplary Embodiment 1

Figure 2:
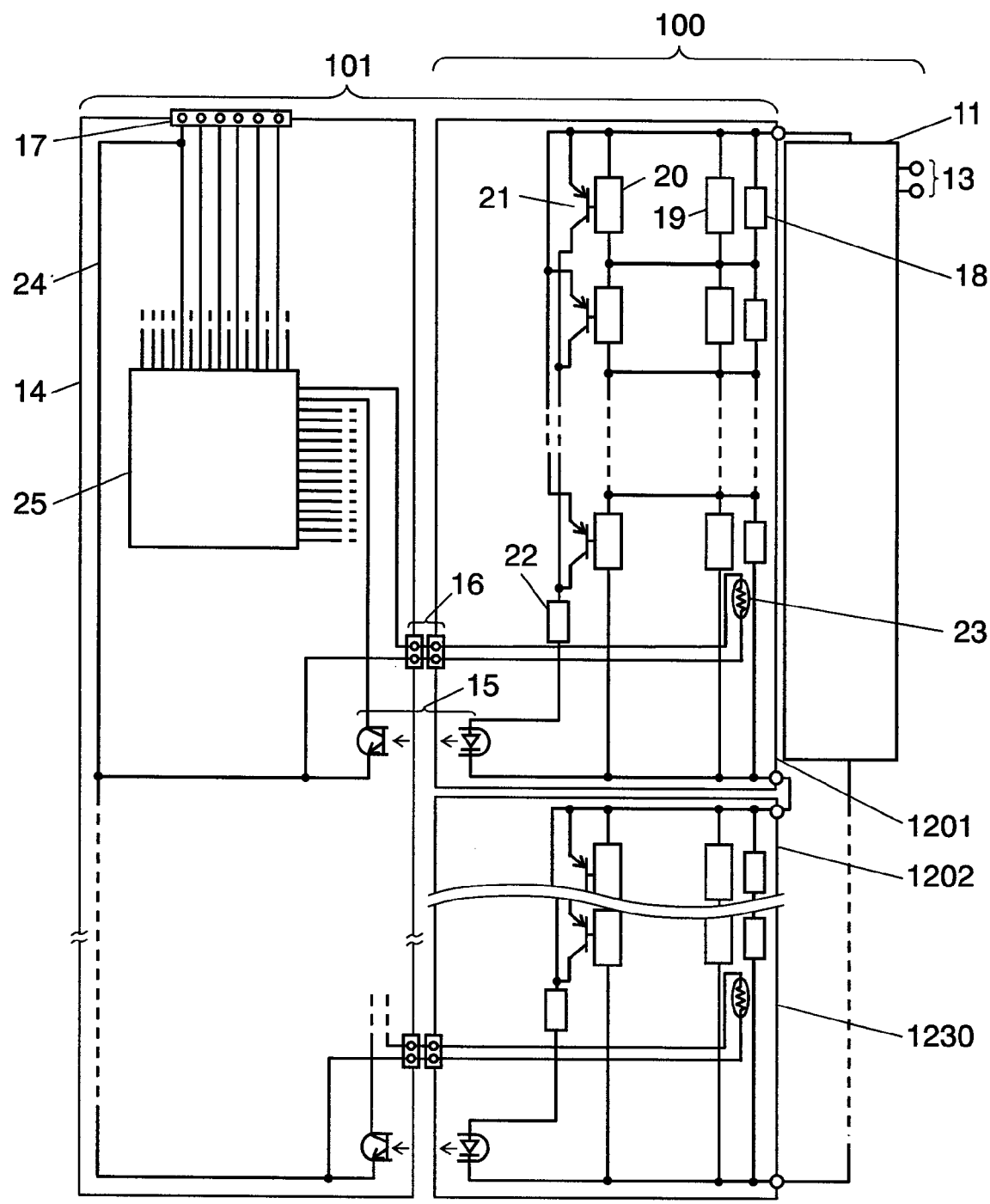
FIG. 2 shows a schematic enlarged block circuit diagram of the detector in accordance with the first embodiment of the present invention for detecting a state of an electrical storage device.

FIG. 1 shows a schematic block circuit diagram of a detector in accordance with the first embodiment of the present invention for detecting a state of an electrical storage device. FIG. 2 shows a schematic enlarged block circuit diagram of the detector in accordance with the first embodiment of the present invention for detecting a state of an electrical storage device. In FIG. 1, electrical storage device 100 is formed of charge/discharge control circuit 11, which governs the charge and discharge of storage device 100, and capacitor blocks 12.

More than one capacitor block 12 can be prepared in response to a necessary voltage and an amount of stored power as shown in FIG. 1. In the first embodiment, approx. 750V is stored, which requires 300 pieces of capacitors, so that 10 capacitors are coupled together in series in one capacitor block 12, and 30 blocks of this capacitor block 12 are coupled together in series.

When electrical storage device 100 is charged, electric power is supplied to power input/output terminals 13 provided to charge/discharge control circuit 11, so that 30 blocks of capacitor blocks 12 can be powered and charged under the control of charge/discharge control circuit 11. When storage device 100 is discharged, the reversal steps are taken, i.e. the power charged to respective capacitor blocks 12 is discharged from power input/output terminals 13 via charge/discharge circuit 11.

The foregoing electrical storage device 100 is equipped with detector 101 for detecting the state of device 100. Detector 101 is formed of capacitor blocks 12 and capacitor-block state outputting circuit 14, which is coupled to 30 pieces of capacitor blocks 12, so that the states of all the capacitors in use can be controlled collectively.

The respective states of capacitor blocks 12 are transmitted to capacitor-block state outputting circuit 14 through optical switch 15 working as electrical indirect coupling means and temperature-sensor connector 16. The mechanism of this transmission is detailed later.

When capacitor-block state outputting circuit 14 determines that a voltage of one of the capacitors exceeds a predetermined value, this information is output from state outputting connector 17, which is coupled to a control unit (not shown) of the hybrid car, so that the control unit can control the hybrid car in response to the output.

A method of detecting an abnormal voltage of one of the capacitors is demonstrated hereinafter. This method can be used also for detecting any voltage state other than the abnormal one. FIG. 2 shows an extracted block circuit diagram illustrating inside of capacitor block 12 and capacitor-block state outputting circuit 14.

First, a structure of capacitor block 12 is described. One typical block is taken as an example out of 30 blocks in total, and this one is referred to as capacitor block 1201. Thus capacitor block 1202 is shown in part below block 1201, and capacitor block 1230 is shown in part at the lowest part of FIG. 2.

Capacitor block 1201 includes capacitors 18, capacitor-voltage equalizing circuits 19, capacitor voltage detecting circuits 20, transistors 21, capacitor block voltage equalizing circuit 22, and temperature sensor 23 in addition to optical switch 15 and temperature-sensor connector 16.

Here, "equalizing" means reducing the fluctuation of capacitor-voltages to an allowable margin of error.

Capacitors 18 are major components for storing electricity, and employ electrical double-layered capacitors excellent in quick charge/discharge performance. Although FIG. 2 shows schematically that 10 pieces of capacitors 18 are coupled in series, but actually, capacitor-voltage equalizing circuit 19 is coupled in parallel to each one of capacitors 18 in order to avoid the deterioration of capacitor 18 due to a voltage exceeding the rated one. Equalizing circuit 19 can be coupled in parallel to a plurality of capacitors 18 in groups.

Equalizing circuit 19 has a reference voltage (2.5V), and when a voltage across capacitor 18 exceeds the reference voltage, equalizing circuit 19 discharges capacitor 18 gradually for keep the voltage always around the reference voltage, namely, circuit 19 equalizes the voltage across capacitor 18.

The foregoing structure allows capacitor-voltage equalizing circuit 19 to adjust respective voltages across each one of capacitors 18 to the reference voltage even if capacitors 18 have dispersions in voltage. However, some capacitor 18 becomes defect, so that it has a voltage higher than the reference voltage. In such a case, equalizing circuit 19 sometimes cannot adjust it. Thus capacitor-voltage detecting circuit 20 is coupled in parallel to capacitor 18 for detecting an abnormal voltage across capacitor 18.

Detecting circuit 20 has a reference voltage (e.g. 3.5V) higher than that of equalizing circuit 19, and compares the voltage across capacitor 18 with this reference voltage. Detecting circuit 20 can be coupled in parallel to a plurality of capacitors 18 in groups. Transistor 21 is coupled to detecting circuit 20 as a switch in order to report a detection of abnormality. Respective transistors 21 are coupled to each one of 10 pieces of capacitors 18 in an OR connection, so that when any capacitor 18 falls in abnormality, a signal reports the abnormality.

In total 10 transistors 21 are coupled to capacitor-block voltage equalizing circuit 22 (in FIG. 2, below transistors 21), which is actually formed of resistors. When any capacitor 18 becomes abnormal, equalizing circuit 22 lowers the voltages of 10 pieces of capacitors 18 all at once immediately, so that the possibility of serious defect such as leakage from the capacitor can be reduced.

Equalizing circuit 22 is coupled in series to a light emitting section of optical switch 15, which emits light when any capacitor 18 becomes abnormal, namely, in this case, transistor 21 is turned on, so that an electric current runs through capacitor-block voltage equalizing circuit 22, then optical switch 15 emits light.

An ambient temperature around capacitors 18 changes their characteristics, so that temperature sensor 23 is prepared for measuring temperatures near capacitors 18. In this first embodiment, a thermistor is used as temperature sensor 23 because the thermistor is highly sensitive to temperature and easy to be placed in a circuit. Temperature sensor 23 supplies its output to temperature-sensor connector 16 having 2 pins.

Next, the structure of capacitor-block state outputting circuit 14 is described hereinafter. Outputting circuit 14 includes a photoreceptor of optical switch 15, and the photoreceptor is placed such that it confronts the light emitting section of optical switch 15 provided to capacitor block 12.

Temperature-sensor connector 16 provided to capacitor block 12 confronts its receptor, i.e. 2-pin temperature-sensor connector 16. The photoreceptor of optical switch 15 and the grounding side of temperature-sensor connector 16 are coupled to grounding wire 24, and the signal side of connector 16 is coupled to state determining circuit 25.

In the same manner, state determining circuit 25 is coupled with the respective foregoing signals supplied from 30 blocks of capacitor blocks 1201-1230. State determining circuit 25 outputs various data such as an existence of abnormality and temperatures to state outputting connector 17.

Operation of detector 101 for detecting a state of the electrical storage device is demonstrated hereinafter. Charge/discharge control circuit 11 applies a voltage across capacitor 18 for charging. At this time, capacitor-voltage equalizing circuits 19 coupled in parallel to respective capacitors 18 adjust the voltages across capacitor 18 to the reference voltage (2.5V).

At this state, if any capacitor 18 should malfunction and its voltage stay over the reference voltage (2.5V) of equalizing circuit 19 and will not lower, capacitor-voltage detecting circuit 20 then determines whether or not the voltage exceeds a predetermined higher reference voltage (3.5V). When the voltage of subject capacitor 18 stays between 2.5V and 3.5V, the state is kept as it is because the possibility of an urgent problem is low although this state slightly shortens the service life of subject capacitor 18. On the other hand, when the voltage exceeds the higher reference voltage, determining circuit 20 outputs a danger signal because capacitor 18 is possibly broken.

The operation discussed above eventually turns on transistor 21 coupled to capacitor-voltage detecting circuit 20. Since transistor 21 is coupled in OR connection, when any capacitor 18 out of 10 pieces of capacitors 18 placed in capacitor block 12 becomes abnormal, an electric current runs through transistor 21. This electric current is supplied from in total 10 pieces of capacitors 18 coupled in series and consumed in the resistors within equalizing circuit 22, so that an overall voltage of 10 pieces of capacitors 18 lowers.

As a result, the voltages of all capacitors 18 can be lowered all at once, so that the safety can be ensured even if a voltage higher than the higher reference voltage is applied to any capacitor 18. Thus a highly reliable system can be achieved.

The foregoing electric current prompts turning on optical switch 15 coupled in series to equalizing circuit 22 and allows the light emitting section to emit light. As a result, the photoreceptor confronting the light emitting section is turned on. Since the current (signal) running through the photoreceptor depends on the on-off of the light, the comparison result of the voltage across capacitor 18 with the reference voltage is digitally output. This digital output allows lowering the influence of malfunction caused by a possible noise riding on the signal, so that reliability can be ensured. The signal arriving at the photoreceptor of optical switch 15 is transmitted to state determining circuit 25.

In the foregoing mechanism, optical switch 15 works as an electrical indirect coupler for transmitting the information of abnormal capacitor 18 from capacitor block 12 to capacitor-block state outputting circuit 14. The use of optical switch 15 allows isolating electrically the high-voltage (applied in the vicinity of capacitors 18) oriented wirings (drawn with bold lines in FIG. 2) completely from the signal-oriented wirings (drawn with narrow lines in FIG. 2), and yet transmitting the information of an abnormality from capacitor block 12 to state outputting circuit 14.

As discussed above, since there is no electrical coupling at all between the high-voltage oriented wirings (bold lines) and the signal-oriented wirings (narrow lines), if a malfunction should happen, a high voltage per se or a high-voltage oriented noise never enters into the signal-oriented wirings. As a result, a highly reliable system is obtainable.

In this first embodiment optical switch 15, i.e. an optical device, is used as the electrical indirect coupler; however, an insulating transformer working as a magnetic device or a relay as a mechanical device can be used instead of optical switch 15.

An output from temperature sensor 23 placed around capacitors 18 is transmitted to state determining circuit 25 via temperature-sensor connector 16. A measured temperature is used only for measuring a resisting value of temperature sensor 23 (thermistor), so that sensor 23 is completely independent of the high-voltage oriented wirings of capacitor block 12. Thus capacitor block 12 is coupled electrically and directly to state outputting circuit 14 by temperature-sensor connector 16.

State determining circuit 25 outputs a signal indicating an abnormality of capacitor 18 to state outputting connector 17, and at the same time, circuit 25 built in capacitor-block state outputting circuit 14 finds the max. and min. temperatures from respective outputs supplied from 30 pieces of temperature sensors 23 provided to each one of capacitor blocks 1201-1230, then outputs the temperatures to connector 17. A signal from connector 17 is transmitted to the control unit of the hybrid car (not shown).

When capacitor 18 has some trouble, or the temperature stands out of a predetermined range and thus possibly accelerates the deterioration of capacitor 18, the control unit carries out the controlling operation such as prompting charge/discharge control circuit 11 to reduce the charging current, or to discharge, or to halt the operation of electrical storage device 100. The overall reliability of the hybrid car can be thus improved.

The foregoing structure and operation allows eliminating the entering of the high voltage per se or the high-voltage oriented noises into the signal-oriented wirings, so that no superimposition of the high voltage or the high-voltage oriented noises on the signals is expected. As a result, a reliable detector for detecting a state of the electrical storage device is obtainable, and the detector can detect a state of the capacitors with confidence.

In this first embodiment the signal supplied from state outputting connector 17 carries the information only about an existence of abnormality, max and min temperatures of capacitors 18. However, the foregoing information can be formed into data by using the data communication technique, and the data includes such as which capacitor block 12 is detected abnormal in state detecting circuit 25 and what are temperatures of respective capacitor blocks 12. Then the data can be transmitted to the control unit of the hybrid car.

In this case, abnormal capacitor block 12 can be identified, so that use of the abnormal block can be avoided. Then the abnormal block can be efficiently replaced and repaired. For this reason, capacitors 18 are divided into a plurality of capacitor blocks 1201-1230. In this first embodiment, capacitors 18 are coupled together in series; however, they can be coupled in parallel or series couplings and parallel couplings can be coexist depending on the necessary power.

Exemplary Embodiment 2

The second embodiment of the present invention demonstrated hereinafter with reference to the accompanying drawings. A method of detecting an abnormal voltage of one of the capacitors is demonstrated hereinafter as the first embodiment does. This method can be used also for detecting any voltage state other than the abnormal one.

Figure 3:
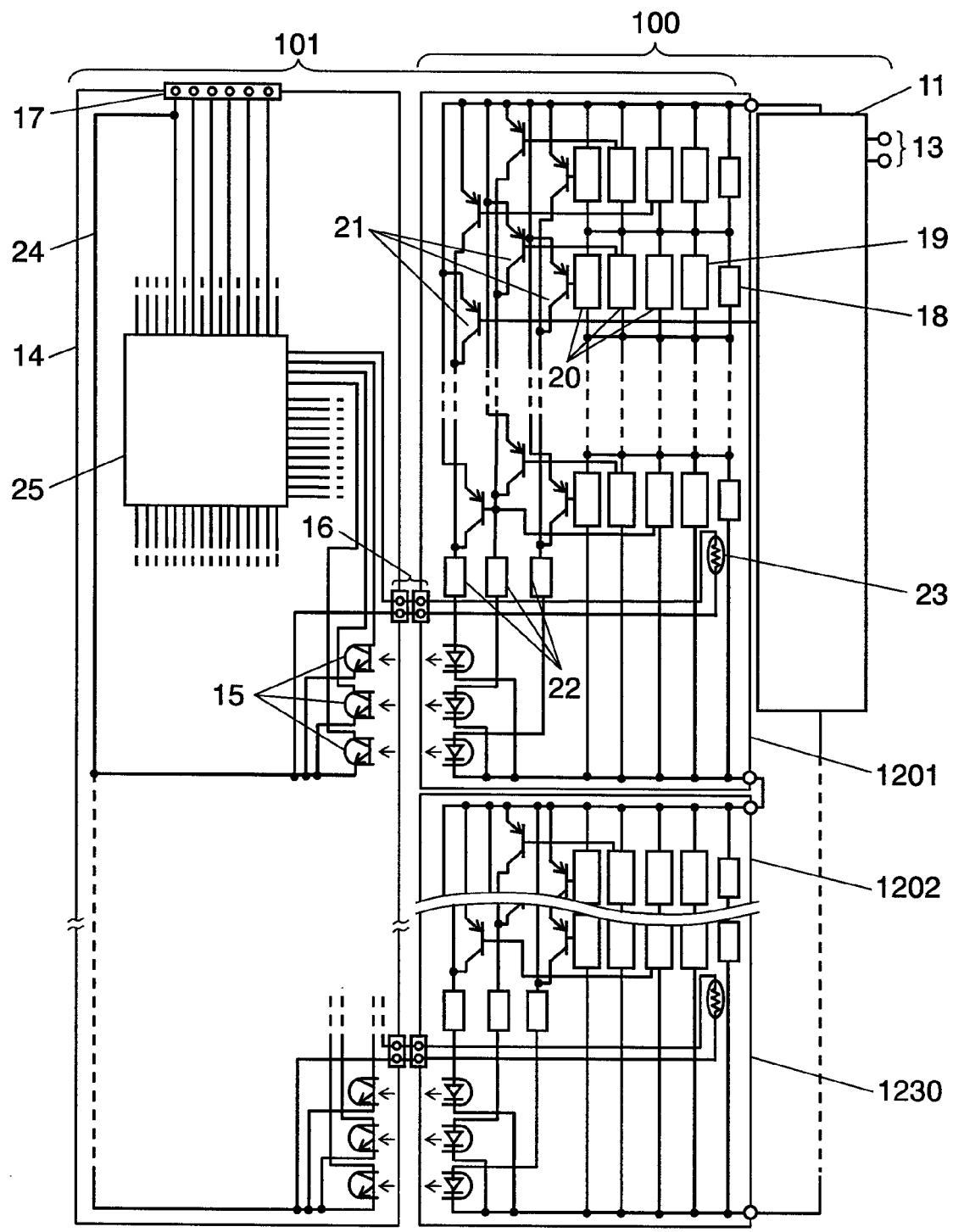
FIG. 3 shows a schematic enlarged block circuit diagram of a detector in accordance with a second embodiment of the present invention for detecting a state of an electrical storage device.

FIG. 3 shows a schematic enlarged block circuit diagram of a detector in accordance with the second embodiment of the present invention for detecting a state of an electrical storage device. In FIG. 3, elements similar to those in FIG. 1 or FIG. 2 have the same reference marks, so that the detailed descriptions thereof are omitted here, and only different sections are described.

The feature of this second embodiment is this: capacitor-voltage detecting circuit 20 coupled in parallel to respective capacitors 18 are prepared in total 3 lines, and transistor 21 coupled to each one of circuits 20 are prepared also in total 3 lines. Meanwhile capacitor-voltage detecting circuit 20 can be provided to a plurality of capacitors 18 in groups. In response to this structure, capacitor-block voltage equalizing circuit 22 and optical switch 15 are prepared in total 3 lines.

The foregoing structure allows setting three levels of critical voltage although the first embodiment can only determine whether or not an abnormal voltage exceeds one critical voltage (3.5V) by using capacitor-voltage detecting circuit 20. For instance, internal reference voltages of circuits 20 can be set at 3V and 2.8V in addition to 3.5V, and then three levels of capacitor voltages can be detected. As a result, three levels of abnormal signals can be output from capacitor 18.

This abnormal signal is fed into state determining circuit 25 via optical switch 15, so that a degree of deterioration of the capacitor can be output from state outputting connector 17. This mechanism allows the control unit of the hybrid car to carry out an elaborate control in response to a degree of trouble. For instance, when only a signal of 2.8V is supplied, a warning is given to the driver of the car while capacitor blocks 1201-1230 keep going. When a signal of 3V is supplied, the capacitor block issuing the signal of 3V is halted in addition to the warning given to the driver. When a signal of 3.5V is supplied, whole capacitor blocks 1201-1230 are halted as the first embodiment does.

An integrated time from the start of using capacitor blocks 1201-1230 until the time when capacitor-voltage detecting circuit 20 outputs a state signal (an abnormal signal in this second embodiment) of the lowest detected voltage (2.8V in this second embodiment) is monitored by state determining circuit 25. Then the integrated time is compared with capacitor's aged deterioration characteristics stored in a memory (not shown) placed in advance in state determining circuit 25, so that the life of capacitor blocks 1201-1230 can be predicted, and the prediction is output from state outputting connector 17.

The structure and operation discussed above allows isolating the high-voltage oriented wirings completely from the signal-oriented wirings, so that the reliability can be ensured. On top of that, the life prediction of the capacitor blocks allows finding deterioration and troubles at an earlier stage, so that the still higher reliability can be ensured.

Exemplary Embodiment 3

The third embodiment of the present invention is demonstrated hereinafter with reference to the accompanying drawings. A method of detecting an abnormal voltage of one of the capacitors is demonstrated hereinafter as the first embodiment does. This method can be used also for detecting any voltage state other than the abnormal one.

Figure 4:
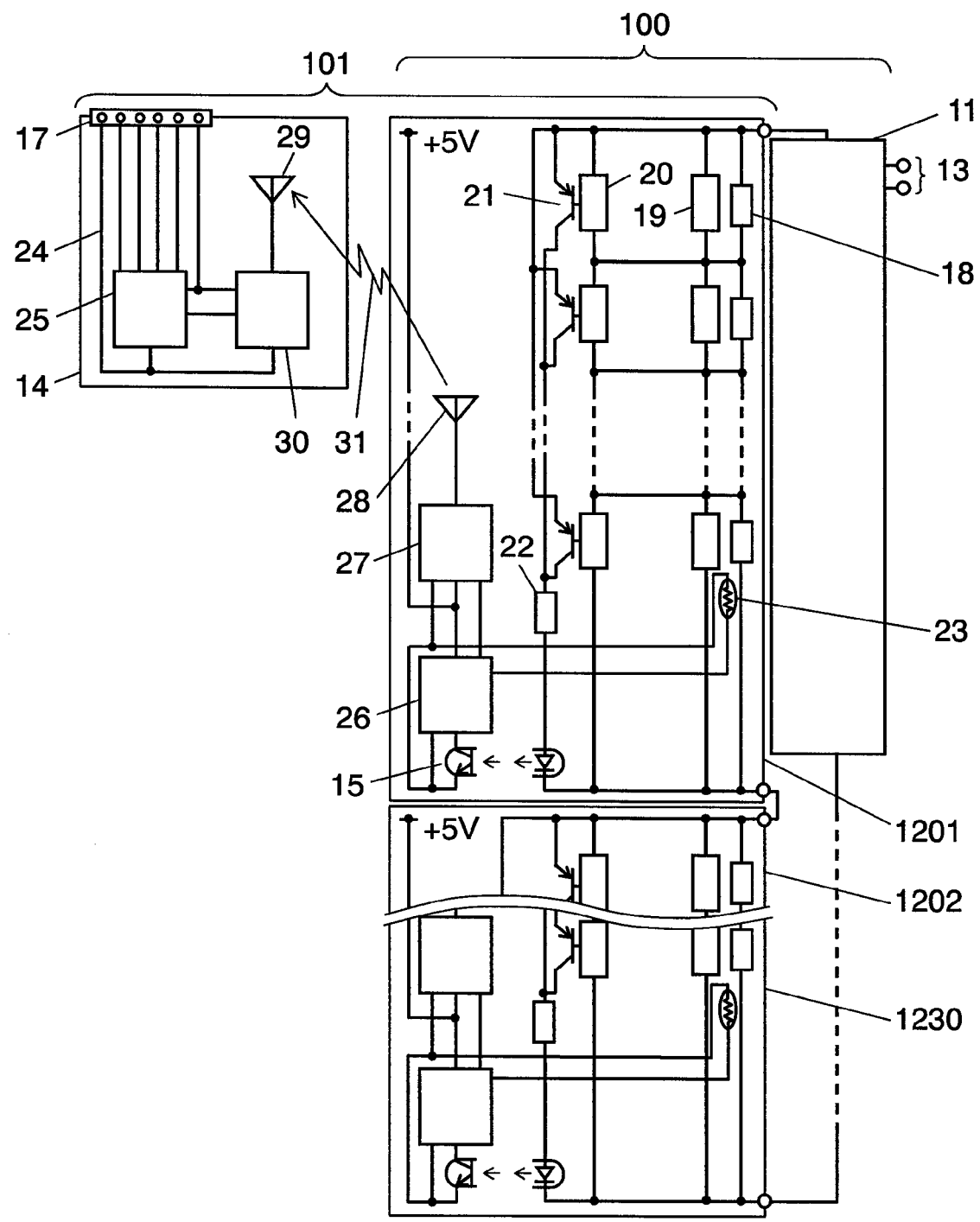
FIG. 4 shows a schematic enlarged block circuit diagram of a detector in accordance with a third embodiment of the present invention for detecting a state of an electrical storage device.

FIG. 4 shows a schematic enlarged block circuit diagram of a detector in accordance with the third embodiment of the present invention for detecting a state of an electrical storage device. In FIG. 4, elements similar to those in FIG. 1 or FIG. 2 have the same reference marks, so that the detailed descriptions thereof are omitted here and only different sections are described.

The feature of the third embodiment is this: a photoreceptor of optical switch 15 is placed in each one of capacitor blocks 1201-1230, and the current (signal) at the photoreceptor and an output signal from temperature sensor 23 are fed into microprocessor 26, and then the digital data of those signals are transmitted to transmission circuit 27, which transmits the data on the radio-wave via transmission antenna 28 coupled to circuit 27.

The transmitted radio wave is received by reception antenna 29 built in capacitor-block state outputting circuit 14 placed near capacitor blocks 1201-1230. Then the radio wave is demodulated to digital data by reception circuit 30 coupled to antenna 29, and the digital data is fed into state determining circuit 25. Then state outputting connector 17 outputs various signals and data as the first embodiment does.

The foregoing structure allows transmitting data via radio wave working as radio transmission/reception medium 31 to capacitor-block state outputting circuit 14, so that the high-voltage oriented wirings can be isolated again from the signal-oriented wirings within capacitor blocks 1201-1230 in addition to the pre-isolation done by optical switch 15. As a result, extremely high reliability can be ensured against the superimposition of the high voltage per se or the high-voltage oriented noises on the signal-oriented wiring.

In this third embodiment, communication via radio wave is carried out between capacitor blocks 1201-1230 and capacitor-block state outputting circuit 14, so that circuit 14 can be substantially downsized and also complicated wirings can be eliminated. As many as 30 blocks of capacitor blocks 1201-1230 can be placed with rather fewer restrictions, so that the circuits can be designed in a more flexible manner.

The structure and operation discussed above achieves double-isolation between the high-voltage oriented wirings and the signal-oriented wirings, so that extremely high reliability can be ensured, and a compact as well as design-flexible detector for detecting a state of an electrical storage device is obtainable.

In this third embodiment, radio wave is used as radio wave transmission/reception medium; however, infrared ray or ultrasonic wave can be used instead. The third embodiment shows an example which introduces the radio wave in the first embodiment, i.e. the radio wave is introduced in one line for detecting the capacitor voltage; however, the radio wave can be introduced in the second embodiment, i.e. the radio wave are introduced in three lines for detecting the capacitor voltage.

Exemplary Embodiment 4

Figure 5:
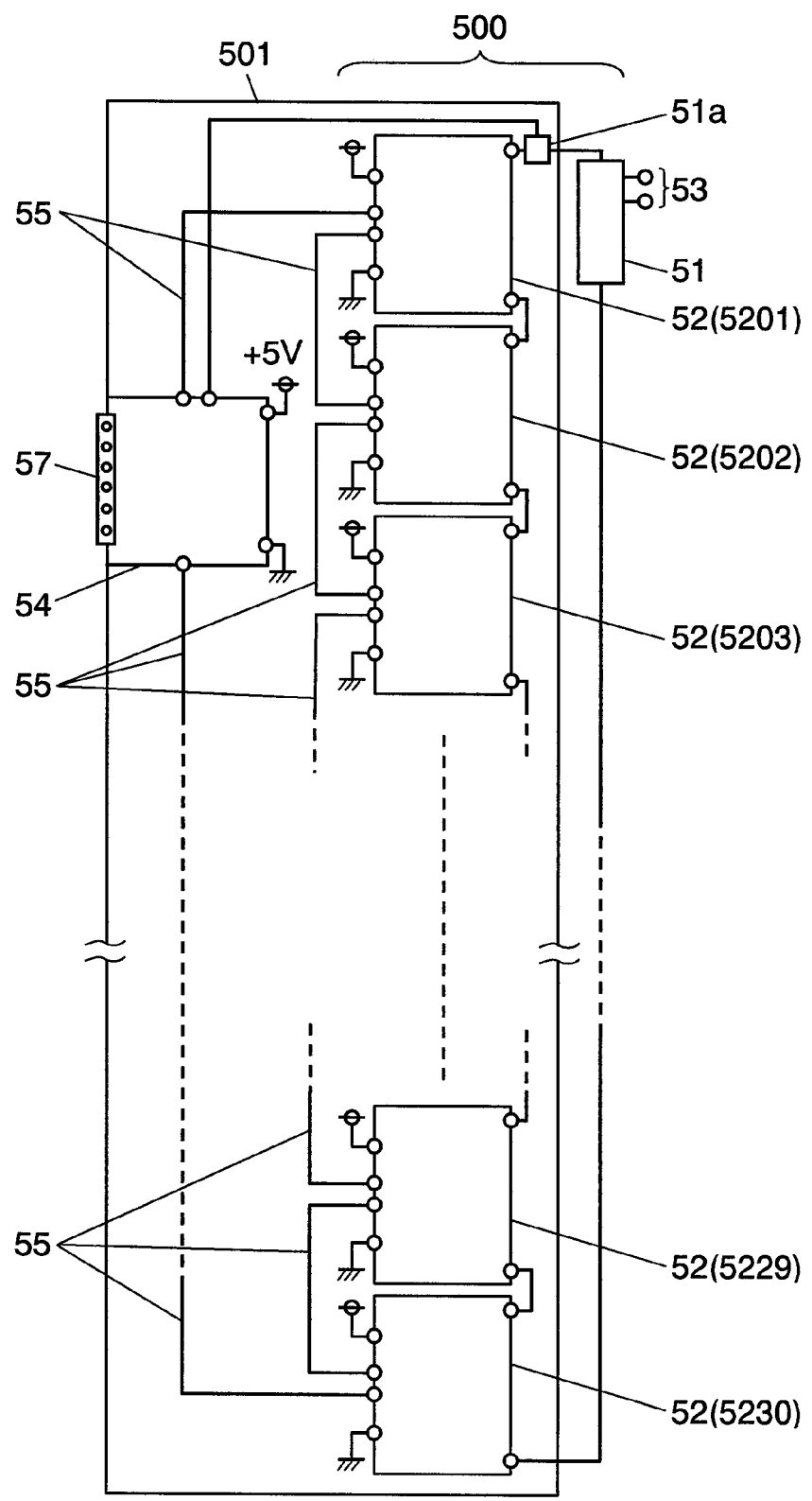
FIG. 5 shows a schematic block circuit diagram of a detector in accordance with a fourth embodiment of the present invention for detecting a state of an electrical storage device.
Figure 6:
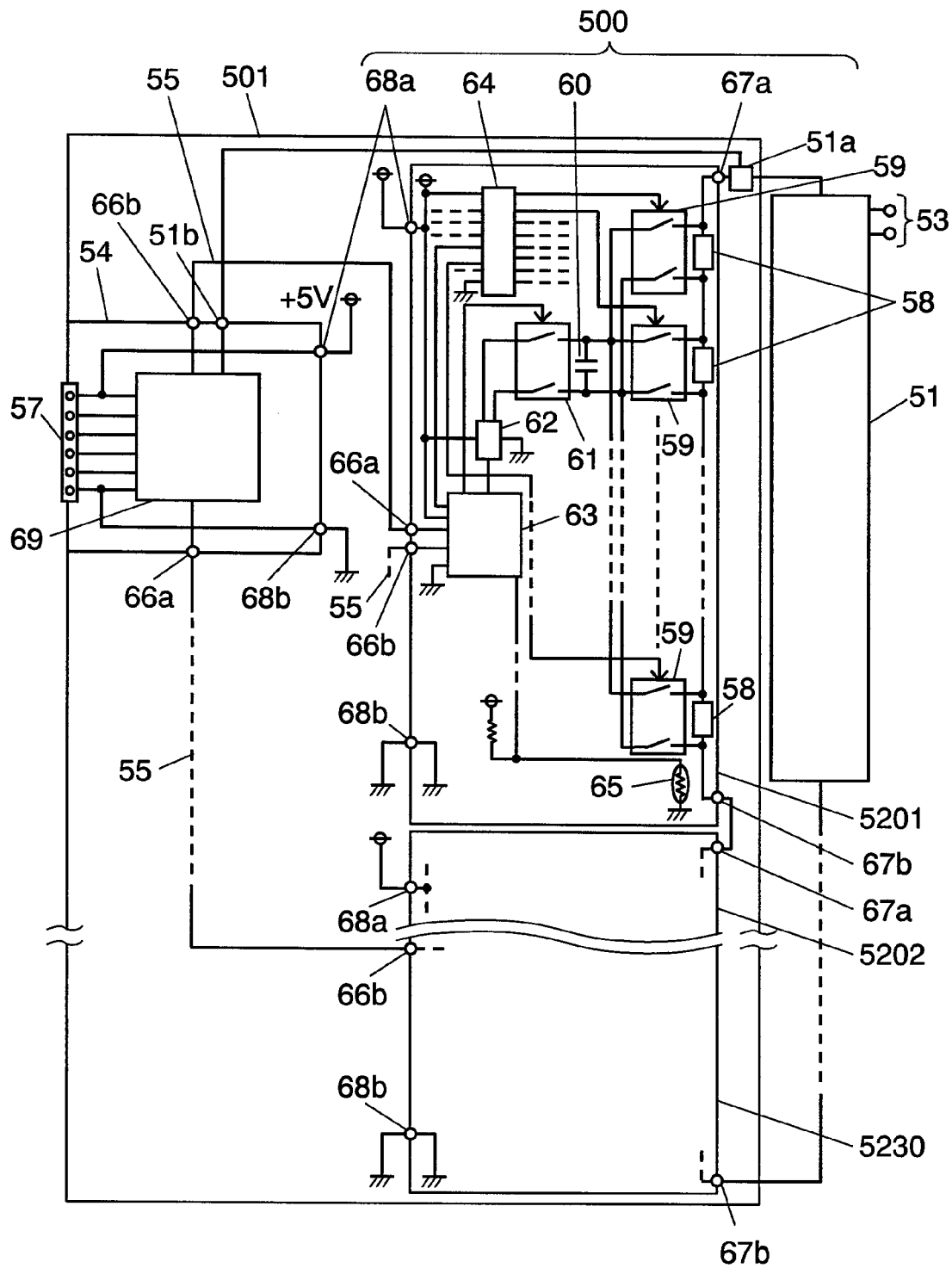
FIG. 6 shows a schematic enlarged block circuit diagram of the detector in accordance with the fourth embodiment of the present invention for detecting a state of an electrical storage device.

FIG. 5 shows a schematic block circuit diagram of a detector in accordance with the fourth embodiment of the present invention for detecting a state of an electrical storage device. FIG. 6 shows a schematic enlarged block circuit diagram of the detector in accordance with the fourth embodiment. In FIG. 5, electrical storage device 500 is formed of charge/discharge control circuit 51 for controlling charge/discharge, and capacitor blocks 52.

A plurality of capacitor blocks 52 can be prepared as shown in FIG. 5 in response to a necessary voltage and an amount of electricity to be stored. In this fourth embodiment, 300 blocks of capacitor block 52 are needed for storing approx. 750V, so that 10 capacitors are coupled together in series in capacitor block 52, and 10 blocks of capacitor block 52 are coupled together in series.

When electrical storage device 500 is charged, electric power is supplied to power input/output terminals 53 provided to charge/discharge control circuit 51, so that 30 blocks of capacitor block 52 can be powered and charged under the control of charge/discharge control circuit 51. When storage device 500 is discharged, the reversal steps are taken, i.e. the power charged to respective capacitor blocks 52 is discharged from power input/output terminals 53 via charge/discharge circuit 51.

Detector 501 is provided to the foregoing electrical storage device 500 in order to detect states of device 500, which state include an abnormality of device 500. Detector 501 is formed of capacitor blocks 52 and capacitor-block state outputting circuit 54.

On top of that, current detector 51a is coupled between an output of charge/discharge control circuit 51 and an input of capacitor block 52 for detecting a charging/discharging current to/from capacitor block 52.

Capacitor-block state outputting circuit 54, which is coupled to 30 blocks of capacitor block 52 (5201-5230), so that the states of all the capacitors in use can be controlled collectively.

As shown in FIG. 5, in respective capacitor blocks 52, the microprocessor built therein and the main computer built in capacitor-block state outputting circuit 54 are coupled together electrically to form a ring-like wired network with data communication medium 55. The wired network formed of data communication medium 55 can be a bus-like coupling, or a star-like coupling by connecting the microprocessor directly to the main computer instead of the foregoing ring-like coupling.

In this case, use of data communication medium 55 in either case discussed above allows reducing the number of and the length of wirings, and yet, the ring-like or bus-like coupling can reduce them by greater amount. In this case, however, if any spot in the network is broken, the communication in whole or in part cannot be carried out, so that the star-like coupling is advantageous over the other two couplings in terms of reliability.

Although the three methods discussed above have advantages and disadvantages, the optimum coupling method can be selected out of the three methods in response to required condition.

The states of respective capacitor blocks 52 are transmitted to the main computer through exchanging data between the microprocessor and the main computer via data communication medium 55. The structure and operation of this mechanism are detailed later.

When capacitor-block state outputting circuit 54 detects an abnormality through the built-in main computer, state outputting connector 57 outputs the fact of abnormality. In this case, since a current output from current detector 51a is taken into circuit 54, the abnormality is determined by referring to the value of current supplied from detector 51a. The method of this determination is also detailed later.

State outputting connector 57 is coupled with the control unit (not shown) of the hybrid car, so that the control unit can control the hybrid car in response to the states of abnormality.

Next, a method of detecting the state is detailed hereinafter with reference to FIG. 6, which shows extracted inner block circuit diagrams of capacitor block 52 and capacitor-block state outputting circuit 54.

First, a structure of capacitor block 52 is described. One typical block is taken as an example out of 30 blocks in total, and this typical one is referred to as capacitor block 5201. Thus capacitor block 5202 is shown in part below block 5201, and block 5230 is shown in part at the lowest part of FIG. 6.

Inside capacitor block 5201, 10 pieces of capacitors 58 coupled together in series are placed (FIG. 6 shows them schematically), and capacitors 58 employ electrical double-layered capacitors excellent in quick charge/discharge performance. Switch 59 is coupled to each one of capacitors 58 for selecting capacitor 58, and switch 59 is formed of two switches in one pair, and the two switches can be turned on or off simultaneously with an external signal.

In this fourth embodiment, switch 59 is coupled to each one of capacitors 58; however, one switch 59 can be coupled to a plurality of capacitors 58 in groups. In this case, information about the plural capacitors 58 as one group is available collectively in return for reducing the number of switches 59 and the wirings thereof.

Switch 59 has terminals opposite to the ones coupled to capacitor 58, and these opposite terminals are coupled in parallel to other switches 59 (in FIG. 6 the upper switches of each one of switches 59 are coupled together with one wiring, and the lower switches of each one of switches 59 are also coupled together with one wiring), and voltage detecting capacitor 60 for detecting a voltage of capacitor 58 is coupled between the respective wirings of the upper switches and the wirings of the lower switches.

Capacitor 60 is further coupled with voltage detecting switch 61 structured as same as switch 59, and the opposite terminal of capacitor 60 is coupled with voltage detector 62 for measuring a voltage of capacitor 60. Meanwhile the voltage of capacitor 60 corresponds to the voltage of capacitor 58 as discussed later. The voltage detected by voltage detector 62 is converted into digital data, which is fed into microprocessor 63.

Microprocessor 63 is coupled with analog switch 64, which switches over switch 59 following the instruction from microprocessor 63, and temperature sensor 65 for measuring a temperature around capacitor 58. A thermistor is used as temperature sensor 65 because the thermistor is highly sensitive to temperature and easy to be placed in a circuit. Microprocessor 63 has data-communication device coupling terminals 66a, 66b for communicating with external devices. Terminal 66a is responsible for data reception and terminal 66b is responsible for data output.

Capacitor block 5201 is provided with high-voltage terminals 67a, 67b for charging/discharging capacitors 58 as well as low voltage terminals 68a, 68b for operating the circuit components such as microprocessor 63 and analog switch 64.

In this embodiment DC 5V is employed as a low-voltage source, and terminal 68a is coupled to DC 5V and terminal 68b is grounded.

Capacitor block 5201 discussed above has no more than six terminals (66a, 66b, 67a, 67b, 68a, and 68b) for being coupled electrically to external devices. A plurality of capacitors 58 are gathered into a block, which is then equipped with circuits necessary for detecting states of capacitors 58, thereby eliminating a huge number and length of wirings conventionally required for detector 501 that detects a state of an electrical storage device.

On top of that, external devices are coupled to capacitor block 5201 via foregoing six terminals, so that block 5201 can be modularized. Block 5201 thus can be detachable from detector 501 at the terminals. This structure allows removing abnormal block 52 and replacing it with a normal one with ease, which shortens a repair time. The conventional structure sometimes invites a replacement of electrical storage device 500 or detector 501 as a whole in the worst case; however, the fourth embodiment proves that only an abnormal capacitor-block can be replaced, so that a repair cost can be reduced in addition to shortening of a repair time.

The detachable structure of capacitor block 52 allows forming electrical storage device 500 proper to respective car models by just mounting a necessary number of capacitor blocks 52 to detector 501 of each car model. Thus electrical storage device 500 can be designed with ease for developing a new model or engineering change of an existing model.

Next, a structure of capacitor-block state outputting circuit 54 is demonstrated hereinafter. Circuit 54 includes main computer 69, which exchanges data transmitted via data communication medium 55 about respective capacitor blocks 52 with the control unit (not shown) of the hybrid car. The data includes, e.g. an abnormal voltage of some capacitor 58 or an abnormal temperature of some block 52, and those data are output from state outputting connector 57. An output current from current detector 51a is fed into main computer 69 via current value input terminal 51b.

State outputting circuit 54 also includes data-communication device coupling terminals 66a, 66b for being coupled to data communication medium 55, and terminals 66a, 66b work in the same way as those marked with 66a, 66b of capacitor block 5201. Terminals 66a, 66b are coupled to main computer 69.

The low-voltage source (DC 5V) for operating main computer 69 is supplied from the control unit of the hybrid car via state outputting connector 57. This low-voltage source is also needed by capacitor block 52, so that it supplies the low voltage to capacitor block 52 via low voltage terminals 68a, 68b (provided for this purpose to capacitor-block state outputting circuit 54), and a low-voltage oriented circuit (not shown) is provided in detector 501 for this purpose also.

Next, an operation of detector 501 for detecting states of the electrical storage device is demonstrated hereinafter. Charge/discharge control circuit 51 applies voltages across capacitor 58 for charging. At this time, voltages across each one of capacitors 58 (ten capacitors are used in one block in this fourth embodiment) of respective capacitor blocks 52 are measured in the following steps according to the instruction of microprocessor 63. Capacitor block 5201 is taken as an example here.

Microprocessor 63 issues an instruction to analog switch 64 to turn on only switch 59 coupled to the upper most capacitor 58 in FIG. 6, so that analog switch 64 turns on switch 59. Since capacitor 58 has an electrostatic capacity far greater than that of capacitor 60, the turn-on of switch 59 allows charging capacitor 60 promptly, and capacitor 60 becomes equal to selected capacitor 58 in voltage. In other words, the voltages across selected capacitor 58 are copied to across capacitor 60.

Microprocessor 63 issues an instruction to analog switch 64 to turn off switch 59 which has been turned on, and directly turns on voltage detecting switch 61 coupled to capacitor 60. Since capacitor block 5201 has only one voltage-detecting switch 61, microprocessors 63 directly turns on or off this switch without using analog switch 64.

The foregoing operation allows voltage detector 62 to measure a voltage across capacitor 60, so that the measured voltage corresponds to a voltage of first capacitor 58. This measured voltage is converted into digital data and transmitted to microprocessor 63. The voltage across capacitor 58 is thus measured not directly by voltage detector 62 but indirectly via capacitor 60, so that capacitor 58, to which a high voltage is applied, is isolated, and only a low voltage can be measured. As a result, voltage detector 62 is not necessarily adaptable to high-voltage, so that the circuit structure can be simplified.

Next, microprocessor 63 turns off voltage detector 61. In this case, turn 6 on detector 61 again for measuring a voltage across capacitor 60 with voltage detector 62, and repeat this operation, then average a plurality of measured voltages for increasing the measuring accuracy. Then issue an instruction to analog switch 64 to turn on switch 59 coupled to capacitor 58, so that the voltage across second capacitor 58 is copied to capacitor 60.

The foregoing operation done to the first capacitor 58 is repeated in the same manner, so that the voltages of capacitors 58 are sequentially transmitted to microprocessor 63, which eventually receives the data of respective voltages of ten capacitors 58, then receives temperature data supplied from temperature sensor 65.

Microprocessor 63 determines the states of capacitors 58 based on those data discussed above, and if a measured voltage exceeds a predetermined voltage, e.g. 3.5V which accelerates deteriorating the capacitor, the information of abnormality is stored in an inner memory. If the measured temperature falls within a temperature range which accelerates deteriorating the capacitor, the information of abnormal temperature is stored in the inner memory. Those operations are repeated at predetermined intervals, so that the updated information is always stored.

An operation similar to what is discussed above is done in capacitor blocks 5202-5230, so that voltage-data of 300 pieces of capacitors 58, temperature data of the respective capacitor blocks, and state-information including abnormality are obtainable. The state information can be expressed, e.g. in 16-bit (2 bytes) memory, namely, lower order 10 bits out of 16 bits are used for expressing the state of capacitor, and higher order 2 bits are used for temperature state.

When no abnormality is found in capacitors 58, all the lower order 10 bits stand at "0" (zero). If Xth capacitor 58 is found abnormal, the Xth bit stands at "1". Thus if all capacitors 58 are found abnormal, all the lower order 10 bits stand at "1". A read of this data allows identifying abnormal capacitor 58 with ease in repairing. The higher order 2 bits express the temperature state, e.g. when the temperature is too low, the highest bit stands at "1", and when the temperature is too high, the second highest bit stands at "1". When no abnormality is found in temperature, both the bits stand at "0".

This method allows one piece of 2-byte memory to cover the comprehensive state of one capacitor block 52, so that the states of capacitors 58 and a temperature state can be simultaneously obtainable, and an abnormality including a type of abnormality can be quickly determined.

These data are output from data-communication device coupling terminal 66b to data communication medium 55, which couples respective capacitor blocks 52 to main computer 69 placed in capacitor-block state outputting circuit 54 in a form of a ring shaped wired network, so that the data supplied from respective blocks 52 are converted following a predetermined protocol by microprocessor 63 before they are transmitted. The method of this data communication is specifically demonstrated hereinafter.

First, the case, where capacitors 58 and the temperature are normal, is described. Main computer 69 transmits a signal to microprocessor 63 built in capacitor block 52 via data-communication device coupling terminal 66b provided to capacitor-block state outputting circuit 54 and data communication medium 55. The signal carries a command to output the updated data (voltages and states of respective capacitors 58 and temperature data) obtained in capacitor block 52. This command is issued at predetermined time intervals.

The data contained in communication medium 55 is transmitted firstly to microprocessor 63 via terminal 66a provided to capacitor block 5201. Microcomputer 63 in block 5201 converts the supplied data in accordance with the predetermined protocol and transmits the converted data to next block 5202 via terminal 66b and medium 55.

Then capacitor block 5202 converts its own data in accordance with the predetermined protocol, and adds it to the data transmitted from block 5201 before transmitting them to the next block 5203. Capacitor block 5203 thus receives data row including the data of both block 5201 and block 5202. Block 5203 then converts its own data in accordance with the predetermined protocol, and adds it to the foregoing data row before transmitting them to next block 5204, which namely receives the data of three blocks 5201, 5202 and 5203.

The operations discussed above are done sequentially for forming the whole data of respective capacitor blocks 52, and finally the whole data is transmitted to main computer 69, which then analyzes the data and outputs the information from state outputting connector 57 that all capacitor blocks 52 are normal. Main computer 69 always monitors the voltage data of all capacitors 58 as well as temperature data of all capacitor blocks 52, so that it can determine an abrupt failure (short circuit or open circuit) of capacitor 58 based on the voltage data in response to the present temperature or a speed of voltage-change (found by the comparison of a previous data with a present data). If any of these failures happens, the fact is output from state outputting connector 57. This operation is detailed later. The foregoing abrupt failure of capacitor 58 can be determined based on the voltage data of respective capacitors 58; however, deterioration progressing at a slow pace over the long span cannot be determined only by the voltage data.

Main computer 69 thus predicts the deterioration of capacitor 58 by using a method of determining deterioration, which method is developed by the inventors of the present invention. This method is disclosed in, e.g. Unexamined Japanese Patent Publication No. 2005-28908. According to this method, although the method is not detailed here, comparison between a deterioration threshold at respective temperatures and a measured temperature allows predicting somewhat the deterioration. The deterioration threshold can be calculated by using capacitor's internal resistance Rc and internal capacitance C, which are found from the data of current values, voltage values and temperatures at the predetermined intervals.

Since main computer 69 has received all the necessary data, it can predict the deterioration through the foregoing deterioration determining method. Thus main computer 69 obtains the information that all capacitor blocks 52 are normal, and still, if some capacitor 58 is deteriorating, this capacitor 58 and capacitor block 52 including the deteriorating capacitor are identified, and the prediction information of the deterioration together with the identifying information is output from state outputting connector 57. As a result, the control unit of the hybrid car can notify the driver of the coming deterioration. The serviceability is thus improved.

Next, the case where capacitor 58 has an abnormal voltage or capacitor block 52 has an abnormal temperature, is discussed hereinafter. In this case, the abnormality should be promptly reported to main computer 69, thus the following operation is recommended.

Assume that capacitor block 5202 becomes abnormal. Then firstly main computer 69 issues a signal that requests data should be output to communication medium 55. Capacitor block 5201 receives the signal; however, block 5201 works normally, so that it converts its own data in accordance with the predetermined protocol as discussed previously, and transmits the converted data to next capacitor block 5202.

Microprocessor 63 of block 5202 contains state information which includes the information about abnormality, so that capacitor block 5202 proves to be abnormal. Microprocessor 63 thus erases the data of block 5201, and converts the state information including the abnormality in accordance with the predetermined protocol before transmitting the data to next block 5203. Since block 5203 works normally, it does not add its own data to the information including the abnormality, and then transmits the information including the abnormality as it is to next block 5204. As discussed above, if an abnormality happens, the normal data thus far are erased and only the data of capacitor block 52 that encounters the abnormality is converted on a priority basis following the predetermined protocol for forming a data row. This mechanism allows reflecting every abnormality to the data row even if plural capacitor blocks 52 fall into abnormality.

The data rows covering all the capacitor blocks 52 are fed into main computer 69. Since these data rows are formed of only the capacitor blocks 52 encountering an abnormality, main computer 69 can promptly know which capacitor 58 and which block 52 fall into abnormality, so that main computer 69 can output the information about the abnormality from state outputting connector 57 in a shorter time accordingly.

As a result, the control unit (not shown) of the hybrid car coupled to state outputting connector 57 can give the driver, e.g. a warning, and control such that electrical storage device 500 should not be used, so that the reliability can be ensured.

In this fourth embodiment, since data communication media 55 are coupled together in a ring shape and form the network connection, the foregoing operation is carried out when an abnormality happens. However, when main computer 69 is coupled directly to respective capacitor blocks 52 (star-like connection), main computer 69 can directly receive the information of abnormality from respective blocks 52. Thus the data communication demonstrated in the foregoing ring-like network connection is not needed although the star-like connection requires longer wirings.

As previously discussed, since respective capacitor blocks 52 are modularized, the information about which block 52 falls into abnormality is indicated by capacitor-block state outputting circuit 54 when an abnormality happens. Thus abnormal block 52 is replaced with new block 52 in decoder 501 following the indication, so that serviceability of repairing can be improved.

However, new block 52 is not known whether or not it satisfies the required electrical specification of electrical storage device 500. For instance, capacitor block 52 to be mounted to another model of the car may be used to this replacement because it can be possible that a different model requires a different power specification of electrical storage device 500. The electrical specification of capacitor block 52 can be different accordingly.

When capacitor block 52 is detached and new one is mounted, main computer 69 thus checks whether or not all capacitor blocks 52 satisfy the required electrical specification. To be more specific, microprocessor 63 has stored the electrical specification of capacitor block 52 in its built-in memory, and when block 52 is replaced with new one, main computer 69 issues an initial check signal. Respective microprocessors 63 transmit their own electrical specifications to main computer 69 in response to the signal. In this case, the specifications are converted following the predetermined protocol as discussed previously for forming the data rows of all the capacitor blocks 52 before they are transmitted to main computer 69.

Main computer 69 checks the electrical specifications of blocks 52 and determines whether or not the electrostatic capacity and voltage characteristics of capacitor 58 satisfy what are required by electrical storage device 500. If some item does not match the required specification, computer 69 outputs which block 52 fails in the specification to state outputting connector 57 coupled to the control unit (not shown) of the hybrid car. Then the control unit, e.g. informs the driver that which block 52 is inadequate, and gives the driver warning of replacing it with normal block 52.

It could happen that abnormal capacitor block 52 because of deterioration, though it satisfies the electrical specification, is mounted. In such a case, since microprocessor 63 built in capacitor block 52 stores the history of abnormalities (information about an abnormality and so on) as discussed previously, the stored history data together with the electrical specification data are transmitted to main computer 69 in response to the initial check signal issued from main computer 69. Then which block 52 is abnormal is informed to the driver and the warning of replacing it with normal block 52 is given.

The structure and operation discussed above prove that a plurality of capacitors 58 are grouped into capacitor blocks 52, and detection of a state of each one of capacitors 58 is completed within block 52, and the detection result is transmitted to main computer 69 via data communication. The numbers of and the length of wirings are thus substantially reduced from the conventional ones, so that a detector for detecting a state of an electrical storage device is achieved with a simple structure.

In this fourth embodiment, 30 blocks of capacitor blocks 52 are coupled together in series; however, they can be coupled in parallel and series mixedly in response to the required power.

Exemplary Embodiment 5

Figure 7:
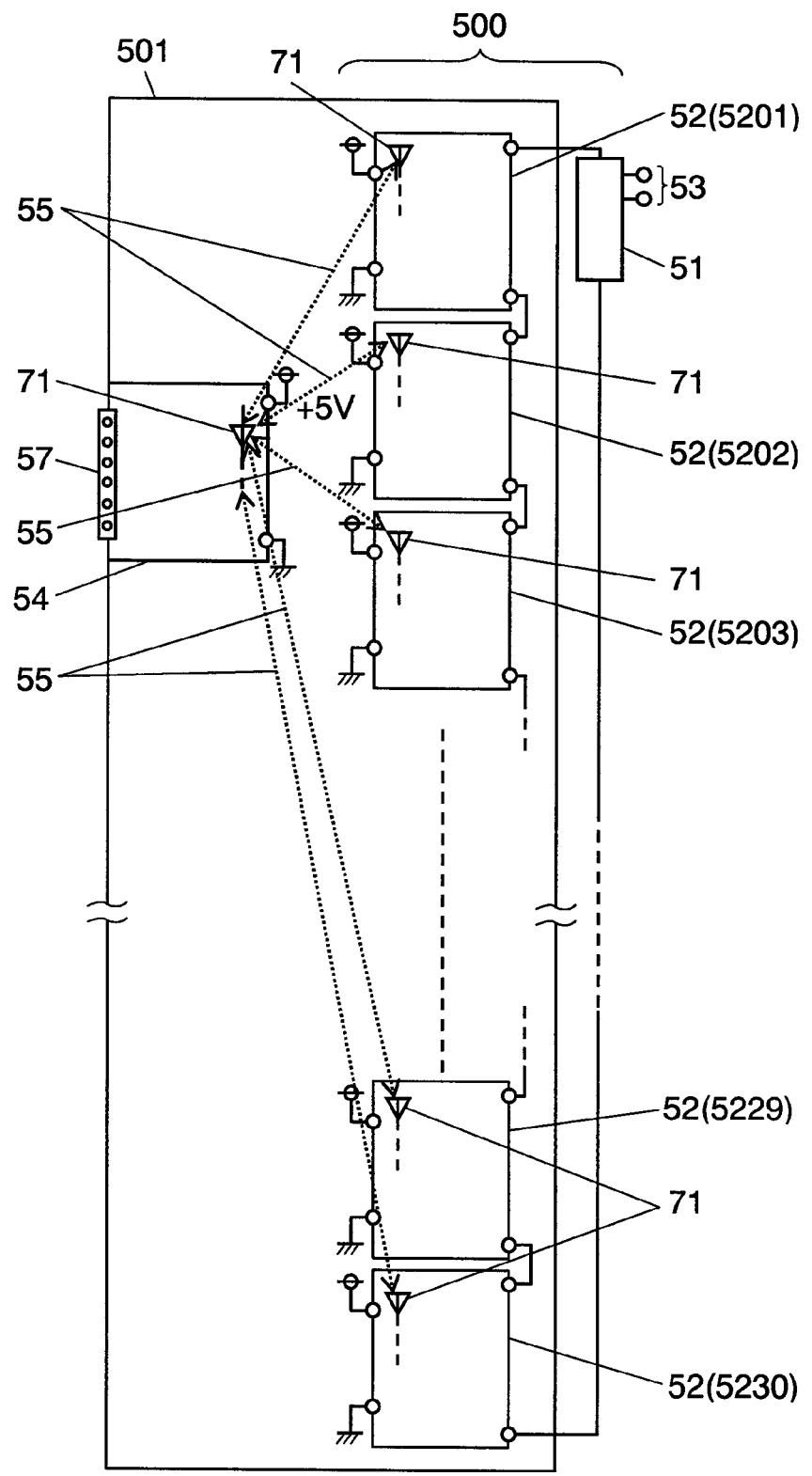
FIG. 7 shows a schematic block circuit diagram of a detector in accordance with a fifth embodiment of the present invention for detecting a state of an electrical storage device.
Figure 8:
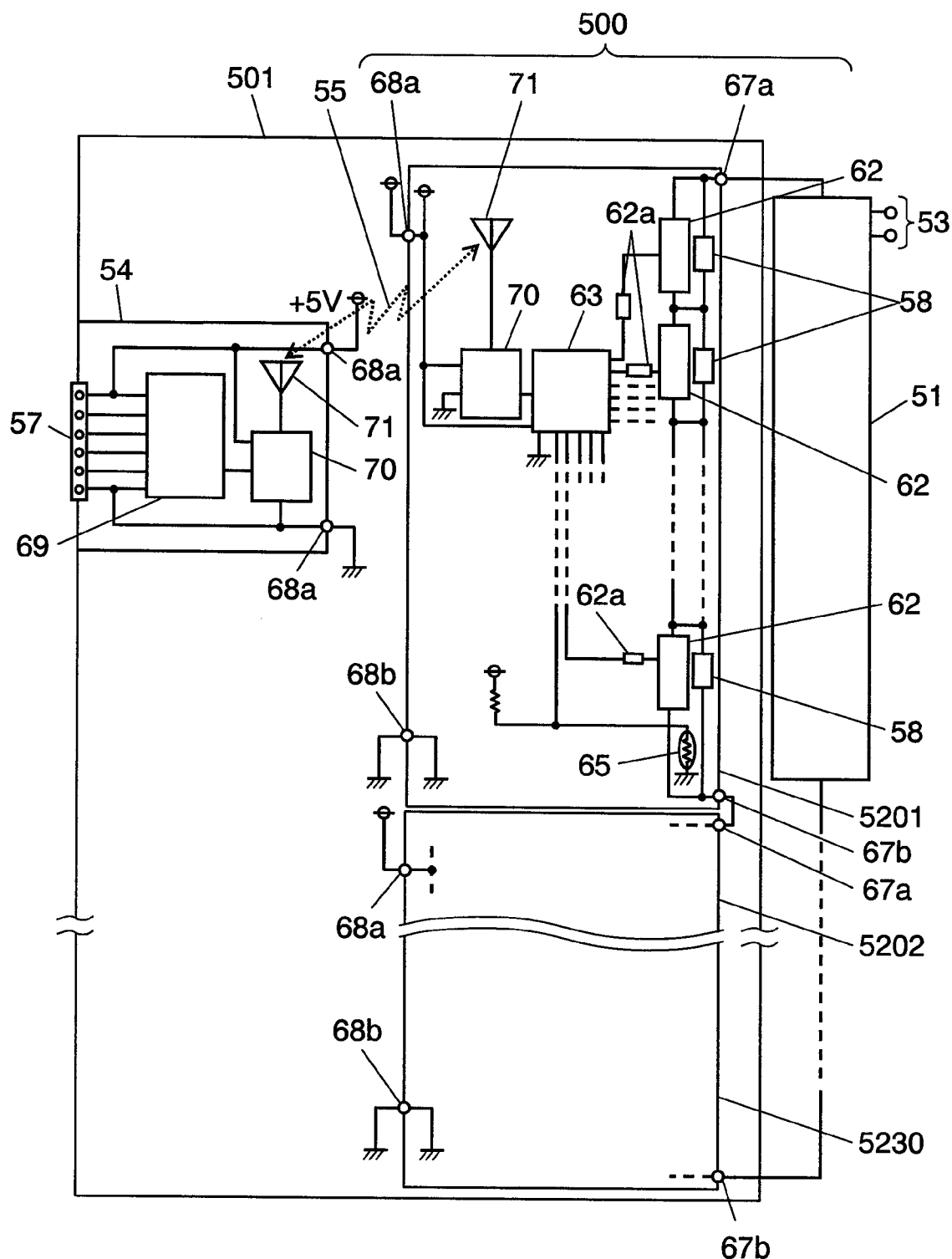
FIG. 8 shows a schematic enlarged block circuit diagram of the detector in accordance with the fifth embodiment of the present invention for detecting a state of an electrical storage device.

The fifth embodiment of the present invention is demonstrated hereinafter with reference to the accompanying drawings. FIG. 7 shows a schematic block circuit diagram of a detector in accordance with the fifth embodiment of the present invention for detecting a state of an electrical storage device. FIG. 8 shows a schematic enlarged block circuit diagram of the detector. In FIGS. 7 and 8, elements similar to those in FIGS. 5 and 6 have the same reference marks, and the detailed descriptions thereof are omitted here. Only the different sections are described hereinafter.

The features of the fifth embodiment are these: as shown in FIG. 7, data communication medium 55 placed between capacitor block 52 and main computer 69 built in capacitor-block state outputting circuit 54 employs radio communication, and as shown in FIG. 8, each one of capacitors 58 has voltage detector 62. These features are detailed hereinafter.

First, as shown in FIG. 8, voltage detector 62 is provided to each one of capacitors 58 for detecting a voltage across capacitor 58. This structure eliminates switches 59 for selecting capacitor 58, analog switches 64 for controlling on/off of switches 59 although those elements are needed in the fourth embodiment, so that this structure needs only simple wirings. As a result, capacitor block 52 can also simplify the wirings.

This fifth embodiment employs voltage detector 62 to each one of capacitors 58; however, capacitors 58 are grouped into some blocks, and one voltage detector 62 can cover one block. In this case, information about the plural capacitors 58 as one block is available collectively in return for reducing the number of switches 59 and the wirings thereof.

The operation of capacitor block 52 is demonstrated hereinafter. A voltage across capacitor 58 is always detected by voltage detector 62, which however only detects whether or not the voltage exceeds the predetermined value. To be more specific, detector 62 compares the voltage across capacitor 58 with a reference voltage to be desirably detected. This reference voltage is, e.g. a voltage over which capacitor 58 deteriorates. If the voltage across capacitor 58 exceeds the reference voltage, a transistor (not shown) built in detector 62 is turned on. Then a signal, e.g. DC 5V, about the abnormality is fed into microprocessor 63 via phototransistor 62a working as an electrical indirect coupler connected to voltage detector 62.

Phototransistor 62a working as an electrical indirect coupler is placed between detector 62 and microprocessor 63 in order to prevent microprocessor from being damaged by a high voltage across capacitor 58. Because the high voltage can be directly input to microprocessor 63 if phototransistor 62a is not there. The electrical indirect coupler can be a photo MOS or a relay instead of the phototransistor.

On the other hand, when the voltage across capacitor 58 is not greater than the reference voltage (capacitor 58 works normally), detector 62 issues no signal, so that phototransistor 62a keeps its output at 0V. Thus the comparison whether or not the voltage across capacitor 58 exceeds the reference voltage is input as an on-off digital signal into microprocessor 63.

The foregoing mechanism cannot tell an absolute value of the voltage across capacitor 58; however, capacitor 58 encountering an abnormal voltage can be directly identified by reading on-off information supplied from a port of microprocessor 63, which port is connected to capacitor 58 in a one-to-one relation. The detecting function is simplified as discussed above, so that an abnormality of capacitor 58 can be detected with simple wirings.

Temperatures can be measured in the same way as in the fourth embodiment, so that microprocessor 63 can obtain data (including information of an abnormality) about the states of capacitor 58 and the temperature within an extremely short time by reading the information supplied from the ports coupled to detectors 62 and temperature sensor 65. The operation discussed above can eliminate the switchover of switches 59 and the measuring carried out in plural times as the fourth embodiment does.

Next, data communication medium 55 between capacitor block 52 and microprocessor 63 employs radio communication, and the reason is this: Microprocessor 63 built in capacitor block 52 is coupled to data transmission/reception circuit 70 which is coupled with transmission/reception antenna 71 for data communication with radio wave.

On the other hand, transmission/reception circuit 70 coupled to main computer 69 and antenna 71 coupled to circuit 70 are built in capacitor-block state outputting circuit 54. Respective circuits 70 are powered by DC 5V supplied via state outputting connector 57 described in the fourth embodiment.

Next, the operation of data communication is demonstrated hereinafter. Respective capacitor blocks 52 always receive the information (abnormal or not) about the states of capacitors 58 and the temperature data. Main computer 69 issues a signal of requesting data transmission to respective capacitor blocks 52 at predetermined intervals. At this time, since there are 30 blocks of capacitor blocks 52 in this fifth embodiment, 30 types of frequency are prepared, and the signal of requesting data transmission is issued at a frequency corresponding to first capacitor block 5201. This signal is issued only to block 5201 and transmitted to microprocessor 63 via antenna 71 and circuit 70.

Upon receiving the signal, microprocessor 63 transmits the data stored in the built-in memory to circuit 70 and then transmits the data from antenna 71. The transmitted data is fed into main computer 69 via antenna 71 and circuit 70 of capacitor-block state outputting circuit 54. Next, main computer 69 issues another signal of requesting data transmission to capacitor block 5202 at a frequency corresponding thereto, and receives the data of block 5202 in the same procedure discussed above.

Main computer 69 thus communicates on radio wave with respective capacitor blocks 52 for receiving all the data while it changes a frequency of the radio wave sequentially.

Next, main computer 69 transmits the information of normality or abnormality about capacitor blocks 52 to the control unit (not shown) of the hybrid car via state outputting connector 57.

As discussed above, use of the radio wave as data communication medium 55 allows eliminating the wirings needed for the ring-shaped network connection discussed in the fourth embodiment, and also allows inputting data to main computer 69 at an extremely high speed.

Since the radio wave is used, the placement of capacitor blocks 52 and capacitor-block state outputting circuit 54 can be changed arbitrarily. For instance, circuit 54 can be an independent unit, which can be placed within the control unit (not shown) of the hybrid car, so that devices can be mounted to the car in the more flexible manner advantageously.

In this fifth embodiment, a frequency is allotted to respective capacitor blocks 52 for radio communication; however, a wireless LAN communication can be used instead. In this case it is not needed to prepare a plurality of frequencies, and yet, the protocol is determined already, so that a transmission/reception system can be developed with ease. When abnormal capacitor block 52 is replaced with another one, which is determined whether it is normal or deteriorated following the same manner as discussed in the fourth embodiment, namely, data is exchanged on the radio wave between capacitor block 52 and main computer 69 upon the replacement before the determination.

Capacitor block 52 in accordance with the fifth embodiment does not have data-communication device coupling terminals 66a, 66b because it transmits/receives data with the radio wave, so that it has only four terminals, namely, high-voltage terminals 67a, 67b and low-voltage terminals 68a, 68b. If capacitor block 52 in accordance with the fourth embodiment is mounted to decoder 501 of this fifth embodiment, it cannot transmit/receive data with the radio wave because it does not have transmission/reception circuit 70 or transmission/reception antenna 71. This fact allows determining that a normal block is not used.

On the contrary, if capacitor block 52 in accordance with this fifth embodiment is mounted to detector 501 in accordance with the fourth embodiment, data communication medium 55 cannot be coupled together in the ring-shaped network because this capacitor block 52 does not have data-communication device coupling terminals 66a, 66b, so that the data cannot be transmitted/received. This fact allows determining that a normal block is not mounted to detector 501.

The long-term prediction of capacitor 58's deterioration described in the fourth embodiment cannot be applied to this fifth embodiment because the voltage across capacitor 58 cannot be measured in this fifth embodiment, so that the deterioration determining method discussed in the fourth embodiment and developed by the inventors cannot be used. As a result, it is impossible to predict deterioration of capacitor 58 over a long span.

Therefore, the application giving a higher priority to the information about prediction of deterioration can adopt the fourth embodiment, and the application giving a higher priority to a simple structure and a flexible placement of capacitor-block state outputting circuit 54 can adopt this fifth embodiment.

The foregoing structure and operation allows exchanging the data of detecting abnormality on the radio wave, so that the number of and the length of wirings can be reduced from the conventional ones. As a result, the detector in the simpler construction for detecting a state of the electrical storage device is obtainable.

In this fifth embodiment, voltage detector 62 outputs an ON signal when it detects a voltage exceeding a given value, and it outputs an OFF signal when it detects a voltage lower than the given value. However, the voltage can be measured by switchover of switch 59 as the fourth embodiment does. In this case the internal wirings become somewhat complicated as that of the fourth embodiment; however, the voltage data can be transmitted/received on the radio wave, so that the deterioration can be predicted over a long span.

This fifth embodiment employs radio wave as data communication medium 55; however, the wired network connection such as a ring-shaped wiring can be employed as is done in the fourth embodiment. In such a case, the circuits needed for the radio wave can be eliminated, so that the simplest circuit structure can be achieved. The voltage data of capacitors 58 do not exist, so that it takes a shorter time proportionately for other data to circulate in respective capacitor blocks 52.

Although the structures discussed above have advantages and disadvantages, the optimum combination of these structures can be expected in response to required specification and condition.

Exemplary Embodiment 6

Figure 9:
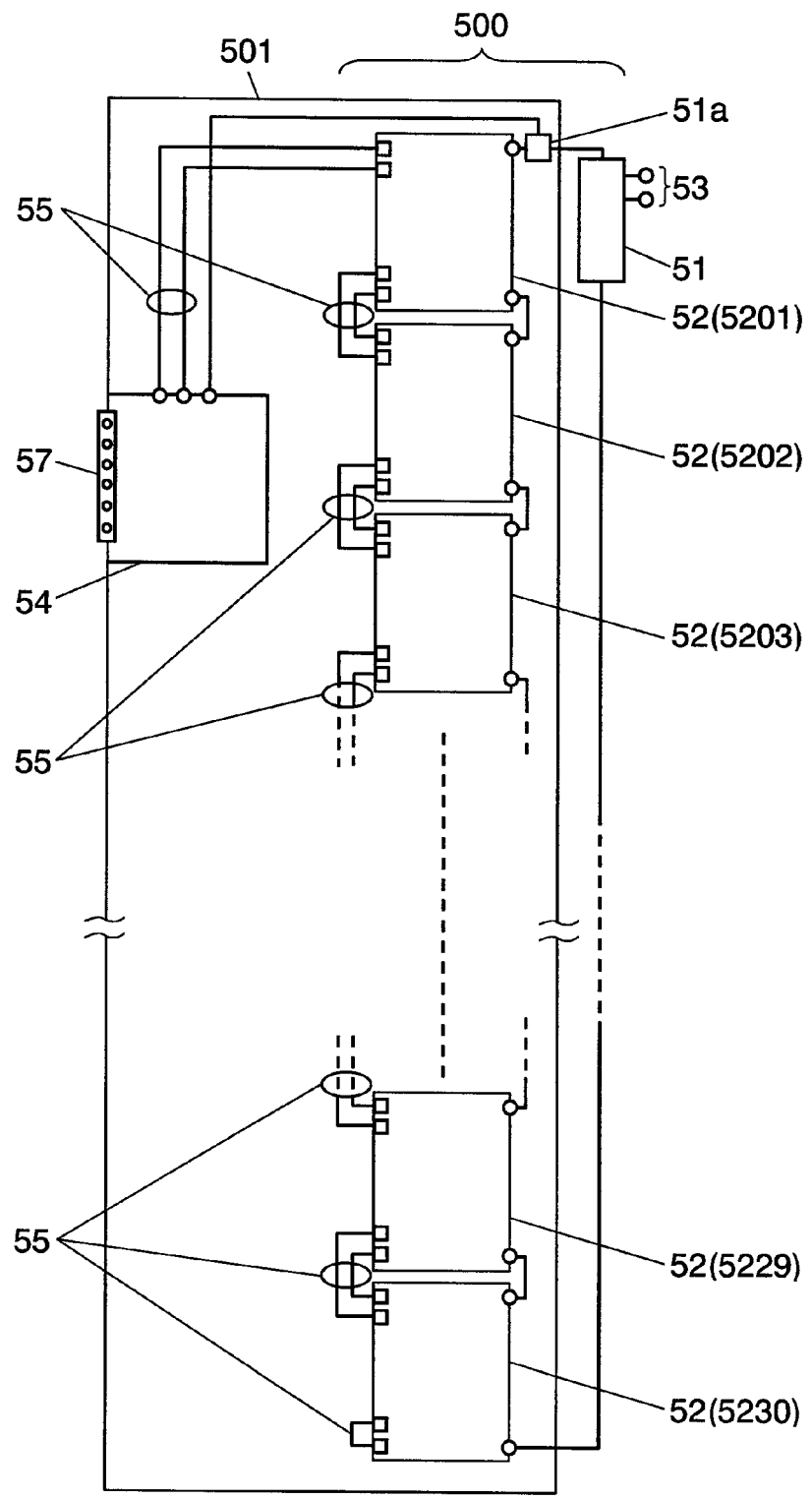
FIG. 9 shows a schematic block circuit diagram of a detector in accordance with a sixth embodiment of the present invention for detecting a state of an electrical storage device.
Figure 10:
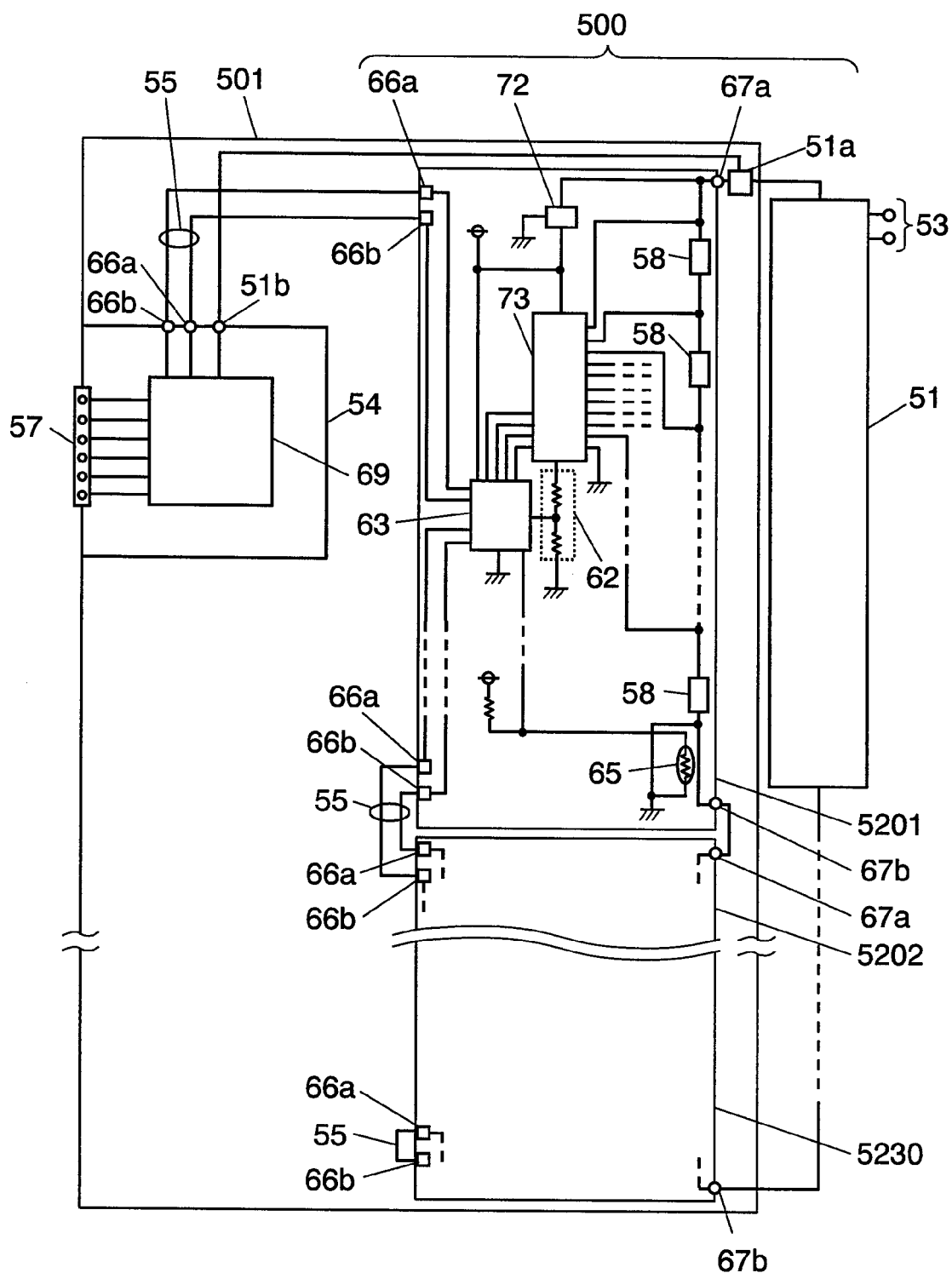
FIG. 10 shows a schematic enlarged block circuit diagram of the detector in accordance with the sixth embodiment of the present invention for detecting a state of an electrical storage device.
Figure 11:
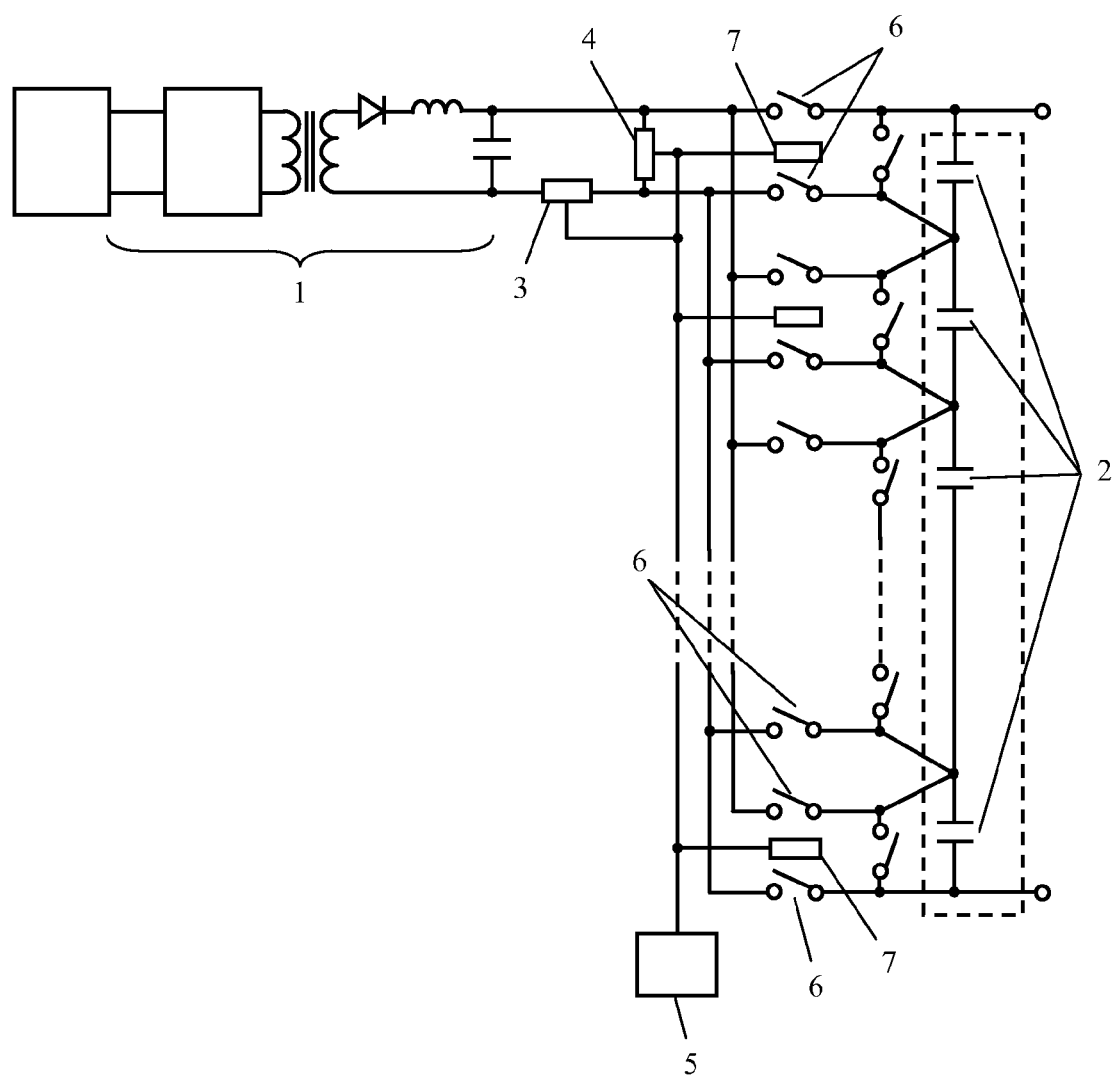
FIG. 11 shows a block diagram illustrating a method of detecting an abnormality of a conventional electrical storage device.

The sixth embodiment is demonstrated hereinafter with reference to the accompanying drawings. FIG. 9 shows a schematic block circuit diagram of a detector in accordance with the sixth embodiment of the present invention for detecting a state of an electrical storage device. FIG. 10 shows a schematic enlarged block circuit diagram of the detector. In FIGS. 9 and 10, elements similar to those in FIGS. 5 and 6 have the same reference marks, and the detailed descriptions thereof are omitted here. Only the different sections are described hereinafter. The sixth embodiment has the following five features:

(1) Data communication medium 55 introduced in the fourth embodiment forms a bus-like wired network connection in this sixth embodiment.

(2) Data communication medium 55 carries a current value fed into the main computer, and state information including a deteriorating prediction and an abnormality of respective capacitors.

(3) Capacitor block 52 produces the low voltage (DC 5V) power source.

(4) Switch 59 employs a multiplexer.

(5) Voltage detector 62 employs a resistor-divided circuit.

The foregoing features are detailed hereinafter.

The first feature makes data communication medium 55 employ a bus-like wired network connection as shown in FIG. 9. This structure needs a twice as many as the number of wirings of medium 55 used in the fourth embodiment; however, the length of the wirings stays approx. the same as the fourth embodiment. Thus this first feature keeps the advantage of reducing the number and the length of the wirings from the conventional ones.

If the wirings of data communication medium 55 are broken, a ring-shaped wired network connection will cut the data communication between all capacitor blocks 52 and the main computer. However, the bus-like wired network connection in accordance with the sixth embodiment can maintain the data communication from the main computer to up until capacitor block 52 immediately before the block 52 encountering the broken line, so that the reliability can be improved proportionately.

Next, the second feature allows the main computer to transmit a current value supplied from current detector 51a to respective capacitor blocks 52 via the data communication, and allows respective capacitor blocks 52 to transmit the state information including the deteriorating prediction and abnormality of the respective capacitors to the main computer via the data communication. This is because of the following reason: In the fourth embodiment discussed previously, a voltage across each one of capacitors built in respective capacitor blocks 52 is transmitted to the main computer, which then predicts the deterioration of all the capacitors over a long span. This mechanism however increases the amount of data communication and burdens the main computer with heavier load of calculation.

Thus the sixth embodiment allows the main computer to transmit the data of the current value to respective capacitor blocks 52 so that the microprocessor built in each block 52 can predict the deterioration over a long span. The calculation of determining the deterioration is thus decentralized to the respective microprocessors and the calculation can be done in a shorter time. On top of that, only the result of calculation is transmitted via the data communication together with the temperature data, so that the amount of data becomes less. As a result, the state information about the respective capacitors can be available within the shorter time with the wirings equivalent to those of the fourth embodiment. Meanwhile the method of predicting and determining the deterioration employed in this sixth embodiment is the same as that of the fourth embodiment.

Next, the third feature is, as shown in FIG. 10, that the low voltage (DC 5V) power source to be used in respective capacitor blocks 52 is produced by using voltage regulator 72 which outputs DC 5V from the voltage across 10 pieces of capacitors 58 coupled in series. The input terminal of voltage regulator 72 receives the maximum voltage across 10 pieces of capacitors 58, in other words, the upper voltage of the upper most capacitor 58 in FIG. 10 is fed into the input terminal of regulator 72. The grounding terminal of regulator 72 receives the min. voltage across 10 pieces of capacitors 58, in other words, it receives the lower voltage of the lower most capacitor 58 in FIG. 10. This voltage thus corresponds to the grounding level in capacitor block 5201. Input of the foregoing two voltages to regulator 72 allows obtaining +5V of DC with respect to the ground level in capacitor block 5201. This DC 5V is supplied to respective circuits (microprocessor 63, multiplexer 73 to be discussed later, and so on) in capacitor block 5201.

As discussed above, each one of capacitor blocks 52 produces the low voltage and supplies it to the respective circuits, thereby eliminating the low-voltage oriented wirings needed in detector 501 in accordance with the fourth embodiment. As a result, the entire wirings can be further reduced. In this case, however, caution should be paid to this fact that respective capacitor blocks 52 have different grounding levels from each other.

For instance, in electrical storage device 500, which can be fully charged up to 750V, the first capacitor block 5201 includes 10 pieces of capacitors 58 rated at 2.5V and coupled in series. The max. voltage across the 10 pieces is 750V and the min. voltage is 725V (=750−2.5×10), so that the grounding level of block 5201 becomes as high as 725V. On the other hand, since capacitor-block state outputting circuit 54 is driven by supply voltage at +5V and grounding level at 0V, there is an extremely large potential difference between circuit 54 and block 5201, so that they cannot be electrically and directly connected by data communication medium 55.

The sixth embodiment thus employs an electrical indirect coupler for connecting these two elements together. To be more specific, a photo MOS, photo transistor, or relay is used as the electrical indirect coupler, and actually data-communication device coupling terminals 66a, 66b are used as the electrical indirect coupler in order to avoid the direct connection between circuit 54 and block 5201.

Next, the fourth feature employs, as shown in FIG. 10, multiplexer 73 as switch 59 used in the fourth embodiment for switching over capacitors 58 when the voltages of respective capacitors 58 are measured. Multiplexer 73 follows an instruction supplied from microprocessor 63 and switches over many switches built in, so that capacitors 58 can be selected with simpler wirings than those of the fourth embodiment.

In this sixth embodiment, the voltages across respective capacitors 58 are directly fed into multiplexer 73, so that the switchover of switch 59 via analog switch 64 is not needed although it is done in the fourth embodiment because of the third feature, i.e. the low voltage power source is produced in capacitor block 52. Since the high-voltage oriented circuits and the low-voltage oriented circuits coexist in the fourth embodiment, the switchover of switch 59 should be done indirectly via analog switch 64 in order to prevent both types of circuits from being coupled electrically to each other. On the other hand, this sixth embodiment sets the grounding level of the low-voltage oriented circuit at the min. voltage of the high-voltage oriented circuit in capacitor block 5201, so that no large potential difference exists in block 5201. As a result, the switchover of switch 59 can be done directly by multiplexer 73.

In this sixth embodiment, the voltages across respective capacitors 58 are fed into multiplexer 73; however, the voltages across a plurality of capacitors 58 in groups can be fed into multiplexer 73. In this case, information about the plural capacitors 58 as one group is available collectively in return for reducing the number of multiplexers 59 and the wirings thereof. The foregoing discussion proves that the wirings in capacitor block 52 can be simplified from those in the fourth embodiment.

Next, the fifth advantage employs a simple circuit, namely, a resistor divided circuit, as voltage detector 62. Use of this simple circuit allows inputting only a resistor-divided midpoint voltage instead of the voltages across respective capacitors 58 (an output from multiplexer 73) directly into an AD converter built in microprocessor 63, so that the wirings in block 52 can be reduced.

The elements other than the foregoing ones remain unchanged from those in the fourth embodiment. The structures and operations previously discussed allow reducing the number of and the length of wirings from the conventional ones, so that the detector in the simpler construction for detecting the state of the electrical storage device is obtainable.

The embodiments discussed hitherto are classified as follows: The data communication and the state output about the voltage detector of capacitor 58 carries the following items:

When a voltage of capacitor 58 is detected through the switchover with an analog switch or a multiplexer, an electric current, capacitor voltage, state information, and temperature are carried through the data communication. An over-voltage of the capacitor, short circuit, open circuit, and abnormal temperature are included in the state output.

When a voltage of capacitor 58 is detected by using an output resulting from comparison with the reference voltage and the electrical indirect coupler, the state information and the temperature are carried via the data communication. An over-voltage, short circuit, open circuit, deterioration over a long span, and abnormal temperature are included in the state output.

Data communication medium 55 can employ a wired network connection (ring-shaped one, bus-like one, or star-like one), or radio wave (at variable frequencies, or wireless LAN).

Embodiments 4-6 only refer to typical three types of combination of the foregoing items. Any combination of the foregoing items allows reducing the number of and the length of the wirings while the high reliability is maintained, and a detector in the simpler construction for detecting a state of an electrical storage device is obtainable. Therefore, the present invention is not limited to the structures discussed in embodiments 4-6, but the structures can be combined arbitrarily in response to a required specification and condition.

INDUSTRIAL APPLICABILITY

A detector of the present invention for detecting a state of an electrical storage device achieves a structure where a high voltage per se or a high-voltage oriented noise cannot superimpose on signal-oriented wirings, so that the reliability can be improved. The structure also reduces external wirings remarkably, thereby achieving the simple structure. Thus the electrical storage device can be useful, in particular, as an auxiliary storage device to the motor driving battery of a hybrid car.

The invention claimed is:

1. A detector for detecting a state of an electrical storage device, wherein the electrical storage device comprises a plurality of capacitor blocks and a charge/discharge circuit for charging or discharging the capacitor blocks, the detector comprising:
   the plurality of capacitor blocks including:
   an electric current detector disposed between the capacitor blocks and the charge/discharge circuit;

a plurality of the capacitors within a capacitor block coupled together one of in series, in parallel, and in serial parallel;

a temperature sensor disposed near a capacitor of said plurality of capacitors;

a switch for selecting said another of said plural of capacitors the capacitor, the switch coupled to each one of the capacitors or a plurality of capacitors in groups;

a voltage detector for measuring a voltage of the capacitor selected by the switch;

a microprocessor for switching over the switch, and receiving outputs from the voltage detector and the temperature sensor; and a data communication medium for receiving and outputting data of the microprocessor; and a main computer for exchanging data with the capacitor blocks and receiving an electric current output from the electric current detector;

wherein the data communication medium carries state information which includes an electric current value supplied to the main computer, a temperature data supplied to the microprocessors of the respective blocks, and a prediction data, found by the microprocessor, about deterioration of the capacitor; wherein the data communication medium gives a higher priority to information to the main computer.

2. The detector of claim 1, wherein the switch is a multiplexer, and voltages of each one of the capacitors or voltages of the plurality of capacitors are output from the multiplexer to the microprocessor via a resistor-divided circuit working as the voltage detector.

3. The detector of claim 1, wherein the main computer predicts deterioration of the capacitor based on an electric current value detected by the electric current detector, voltage values of the capacitors, changing speeds of the voltage values, and temperatures of the capacitor blocks.

4. The detector of claim 1, wherein a minimum voltage of voltages across the plurality of the capacitors coupled together in series in each one of the capacitor blocks is set as a grounding level of each one of the capacitor blocks, and the detector further includes a voltage regulator receiving the minimum voltage and a maximum voltage of the voltages across the plurality of the capacitors for supplying a predetermined voltage to respective circuits in each one of the capacitor blocks.

5. The detector of claim 4 further comprising an electrical indirect coupler disposed in the capacitor blocks and coupled to the data communication medium.

6. The detector of claim 1, wherein the data communication medium is formed of a wired network which couples the capacitor blocks to the main computer.

7. The detector as defined of claim 1, wherein the data communication medium disposed between the capacitor blocks and the main computer is actualized by radio wave.

8. The detector of claim 1, wherein the microprocessor stores electrical specifications of the capacitor blocks and history of abnormality of the capacitors, and the specification and the history are transmitted via the data communication medium to the main computer.

* * * * *

UNITED STATES PATENT AND TRADEMARK OFFICE
CERTIFICATE OF CORRECTION

PATENT NO. : 7,647,191 B2 Page 1 of 1
APPLICATION NO. : 11/720136
DATED : January 12, 2010
INVENTOR(S) : Kakiuchi et al.

It is certified that error appears in the above-identified patent and that said Letters Patent is hereby corrected as shown below:

Column 24, line 22, delete the words "as defined" which are after the word --detector-- and before the word --of--

Signed and Sealed this

Sixth Day of April, 2010

David J. Kappos
*Director of the United States Patent and Trademark Office*

UNITED STATES PATENT AND TRADEMARK OFFICE
CERTIFICATE OF CORRECTION

| | |
|---|---|
| PATENT NO. | : 7,647,191 B2 |
| APPLICATION NO. | : 11/720136 |
| DATED | : January 12, 2010 |
| INVENTOR(S) | : Kakiuchi et al. |

Page 1 of 1

It is certified that error appears in the above-identified patent and that said Letters Patent is hereby corrected as shown below:

On the title page, item [75] inventors, replace the name "Yoksuke" to --Yohsuke--

Signed and Sealed this

Twenty-seventh Day of April, 2010

David J. Kappos
*Director of the United States Patent and Trademark Office*